(12) United States Patent
Lewison

(10) Patent No.: US 7,893,365 B2
(45) Date of Patent: Feb. 22, 2011

(54) WEATHER RESISTANT VARIABLE ENCLOSURE FRAME

(75) Inventor: Steve Lewison, Prior Lake, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 291 days.

(21) Appl. No.: 12/268,114

(22) Filed: Nov. 10, 2008

(65) Prior Publication Data

US 2010/0116545 A1 May 13, 2010

(51) Int. Cl.
*H01L 23/02* (2006.01)
*H05K 5/06* (2006.01)

(52) U.S. Cl. .................. 174/564; 361/796; 361/724; 312/223.2

(58) Field of Classification Search ............ 174/564, 174/520, 560; 361/724, 796; 312/223.2
See application file for complete search history.

(56) References Cited

U.S. PATENT DOCUMENTS

| | | | |
|---|---|---|---|
| 6,039,414 A | | 3/2000 | Melane et al. |
| 6,359,218 B1 | | 3/2002 | Koch et al. |
| 6,788,535 B2 | * | 9/2004 | Dodgen et al. ............... 361/695 |
| 7,245,485 B1 | * | 7/2007 | Morrell ................... 361/679.48 |
| 7,360,660 B2 | * | 4/2008 | Tsuzuki .................... 211/41.17 |
| 7,385,147 B2 | * | 6/2008 | Garmong ..................... 174/364 |
| 7,450,382 B1 | * | 11/2008 | Fischer et al. ............... 361/695 |
| 7,532,482 B2 | * | 5/2009 | Miller et al. ................ 361/752 |
| 2002/0064035 A1 | * | 5/2002 | Mair et al. .................. 361/800 |
| 2005/0201073 A1 | * | 9/2005 | Pincu et al. ................. 361/797 |
| 2006/0059790 A1 | * | 3/2006 | Yeung ........................ 52/36.5 |
| 2007/0175648 A1 | * | 8/2007 | Francisquini ................ 174/50 |
| 2007/0247809 A1 | * | 10/2007 | McClure ..................... 361/695 |
| 2008/0238270 A1 | * | 10/2008 | Wayman et al. ............. 312/199 |
| 2008/0278912 A1 | * | 11/2008 | Zavadsky et al. ............ 361/697 |

\* cited by examiner

*Primary Examiner*—Hung V Ngo
(74) *Attorney, Agent, or Firm*—Fogg & Powers LLC

(57) ABSTRACT

A weather resistant variable enclosure frame configured to enclose at least one electronic component is provided. The weather resistant variable enclosure frame includes a top and bottom endplate each having a channel on at least one side surface, and at least one cut-to-length supporting structure attached to the top endplate and the bottom endplate to offset the top endplate from the bottom endplate. The supporting structure has at least one channel that extends the length of the supporting structure. At least one opening is formed by the endplates and the supporting structure, so that the channels in the endplates and the at least one supporting structure combine to form at least one continuous channel configured to hold at least one respective continuous seal. When panels are attached to cover the at least one opening, a weather resistant enclosure is formed.

21 Claims, 32 Drawing Sheets

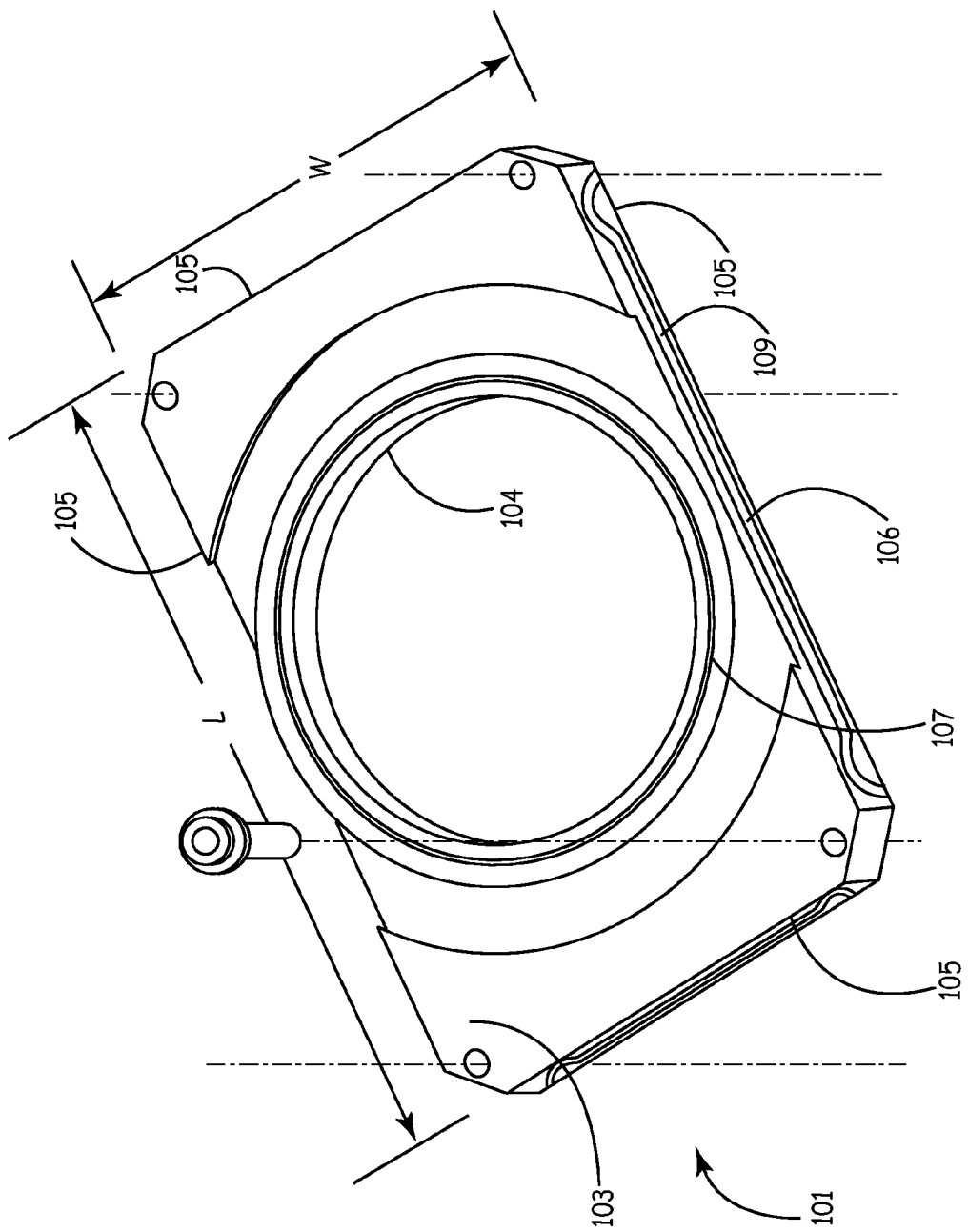

WEATHER RESISTANT VARIABLE ENCLOSURE FRAME

BACKGROUND

With the introduction of various types of electronic components, a method to enclose the components has become a staple of the electronic industry. Current enclosure structures often use pre-determined shaped structures. Little flexibility is given to fitting the electronic components into the enclosure. Currently, if an electronic component does not fit into a current enclosure, a new enclosure must be obtained. In some cases, an enclosure that is too large for the given electronic component is selected so the enclosure takes up more space at field installation than is necessary. Often, the required size enclosures simply do not exist and a new enclosure to accommodate the electronic components needs to be designed and a new manufacturing process needs to be developed. Indeed, the access to current enclosures is limiting and often, electronic components located deep inside the enclosure are difficult to reach due to current enclosure having a limited number of access points. This greatly hinders the replacement and fitting of electronic components.

For reasons stated above, and for other reasons stated below which will become apparent to those skilled in the art upon reading and understanding the present specification, there is a need in the art for improvements to the flexibility and access of weather resistant electronic component enclosures.

SUMMARY

The above mentioned problems with the flexibility and access to electronic component enclosures and other problems are addressed by embodiments of the present invention and will be understood by reading and studying the following specifications.

The present application relates to a weather resistant variable enclosure frame. The enclosure frame includes a top endplate having a channel on at least one side surface and a bottom endplate opposing the top endplate having a channel on at least one side surface. The enclosure frame also includes at least one supporting structure attached to an inner surface of the top endplate and an inner surface of the bottom endplate. The supporting structure offsets the top and bottom endplates. The at least one supporting structure comprises a cut-to-length piece. The supporting structure also comprises at least one channel that extends the length of the supporting structure. At least one opening is formed by the top endplate, the bottom endplate, and the at least one supporting structure. The channels in the top endplate, the at least one supporting structure, and the bottom endplate combine to form at least one continuous channel configured to hold at least one respective continuous seal. The at least one supporting structure is configured to attach a panel to each of the continuous seals, so that when at least on panel is attached to cover the respective at least one opening, a weather resistant enclosure is formed.

In another embodiment, a method to assemble the weather resistant variable enclosure is provided. The method includes attaching a top endplate to at least one supporting structure at a first end surface and attaching a bottom endplate to the at least one supporting structure at a second end surface opposing the first end surface. The supporting structure is extruded and is formed of cut-to-length pieces.

In yet another embodiment, a method to form the endplates is provided. The method comprises forming a rectangular piece having an inner surface, an outer surface opposing the inner surface and four side surfaces. At least one of the four side surfaces has a channel that extends from a first portion of an edge between the inner surface and a respective side surface to a second portion of the edge.

DRAWINGS

FIGS. 1A-1C and 1E show views of one embodiment of an endplate in accordance with the present invention.

DETAILED DESCRIPTION

In the following detailed description, references are made to the accompanying drawings that form part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical changes may be made without departing from the spirit and scope of the present invention. The following detailed description is therefore, not to be taken in a limiting sense.

Embodiments of enclosure frames according to the present invention are described below. In the illustrated embodiments, the enclosure frames are designed to enclose at least one electronic component. The illustrated enclosure frames comprise a number of configurations, each containing a number of common elements. These common elements include two opposing endplates and at least one supporting structure. The supporting structures consist of cut-to-length pieces. The endplates contain at least one channel on a side surface. In one embodiment, the endplates contain at least a V-band flange port. The supporting structures in a given frame are all of equal length. In one embodiment, the supporting structures are not of equal length. The supporting structures also contain at least one channel which extends the length of the supporting structure. The supporting structures are configured so a panel can be attached to each supporting structure. In one embodiment, the supporting structures each contain at least one T-slot that extends the length of the supporting structure.

The enclosure frame has openings formed by the endplates and supporting structures. A continuous seal is inserted into a continuous channel formed by the channels in the top and bottom endplates and the supporting structures. In one embodiment, the continuous seal is a seamless seal. For example, the continuous seal is a loop seal and is therefore seamless. When panels or doors are attached to the enclosure to cover the openings, a weather resistant enclosure is formed to protect the at least one electronic component housed in the enclosure.

Figure 1B:
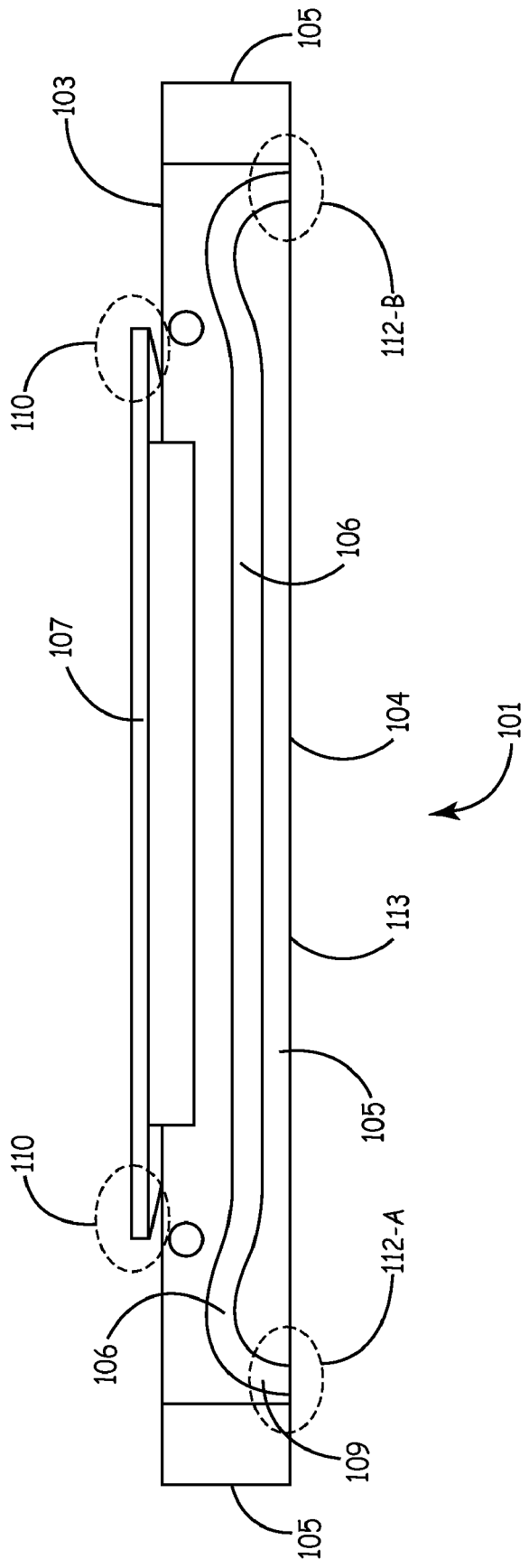
Figure 1C:
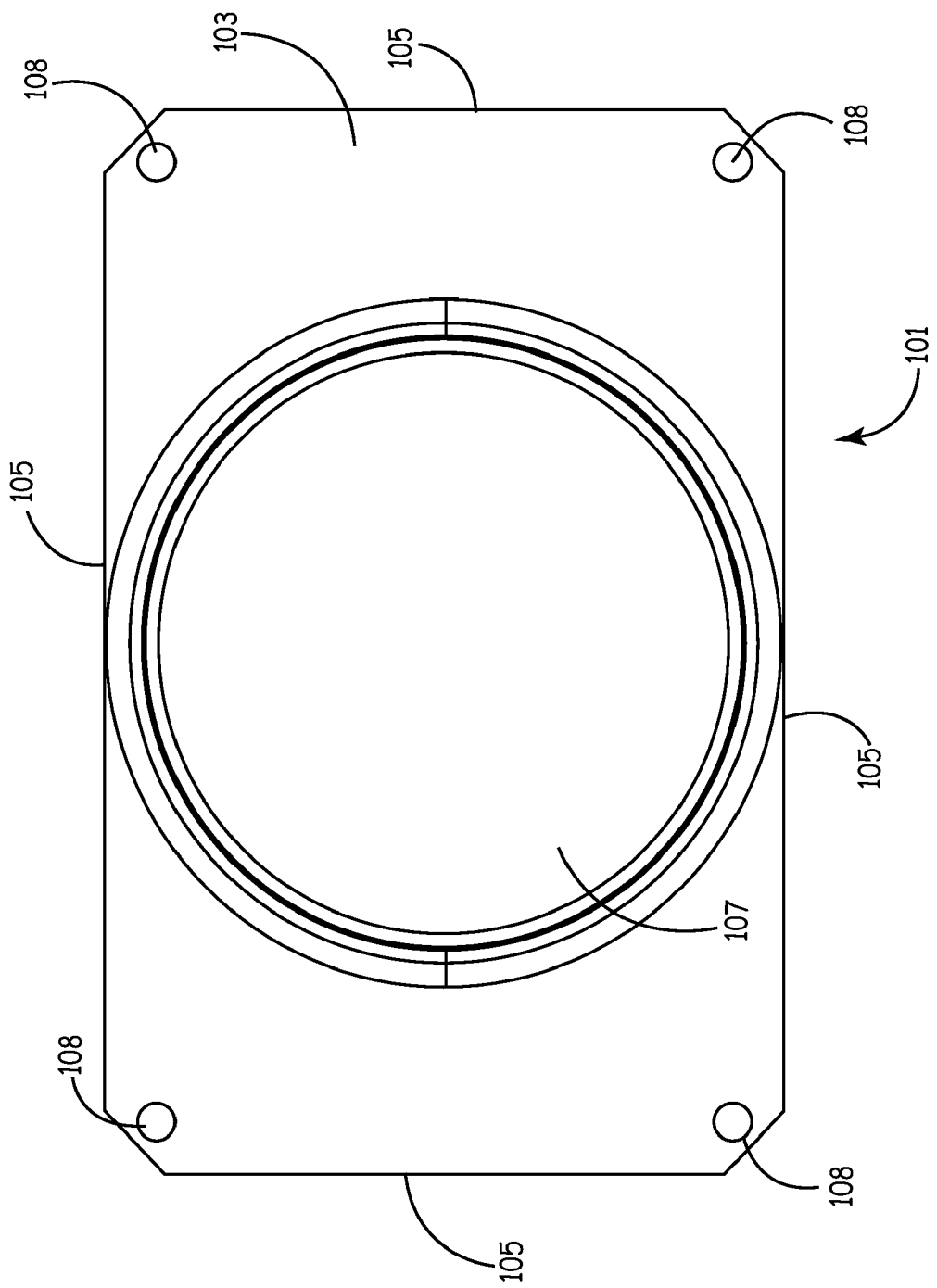
Figure 1D:
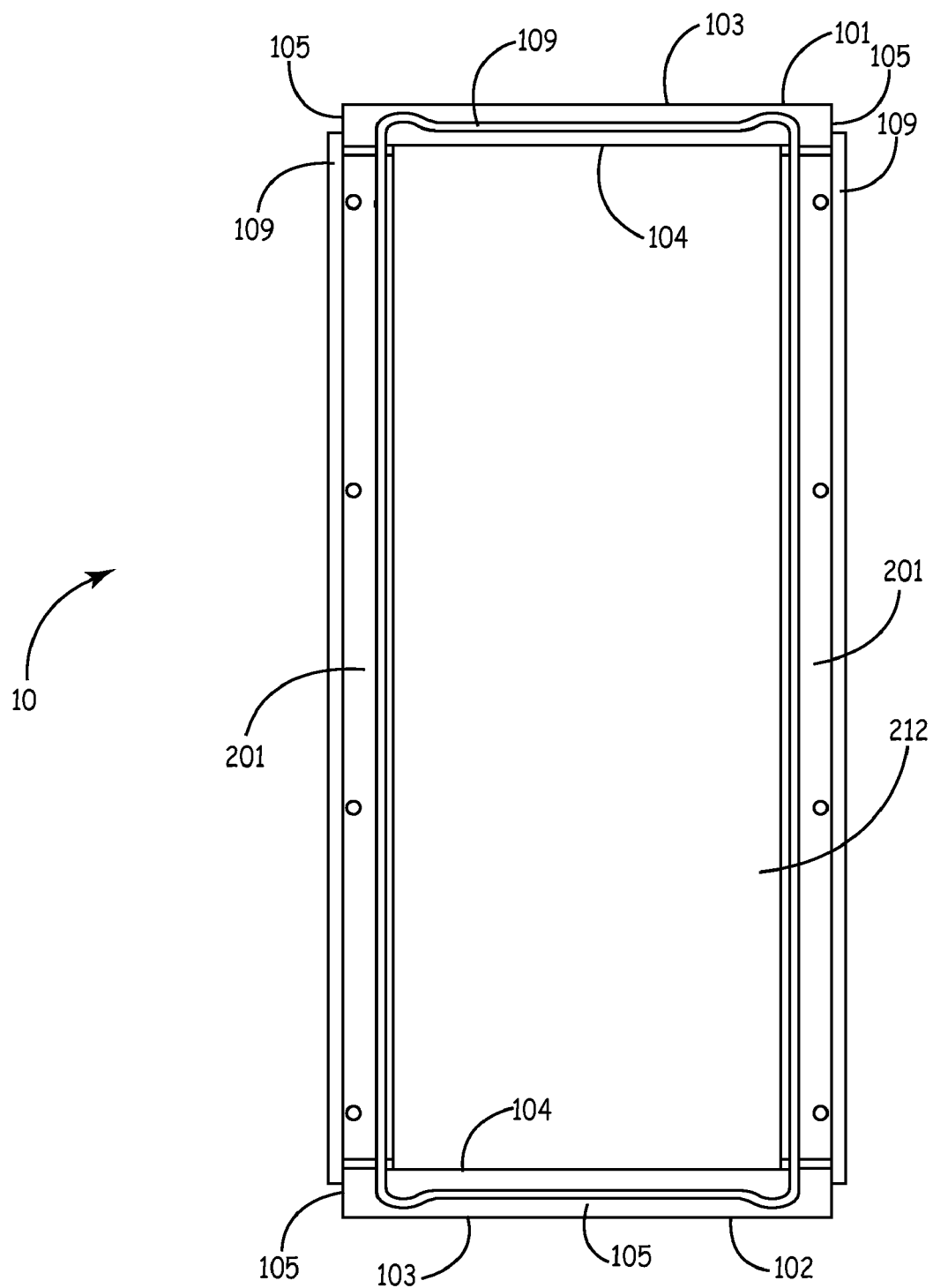
FIG. 1D shows a side view of one embodiment of an enclosure frame in accordance with the present invention.
Figure 1E:
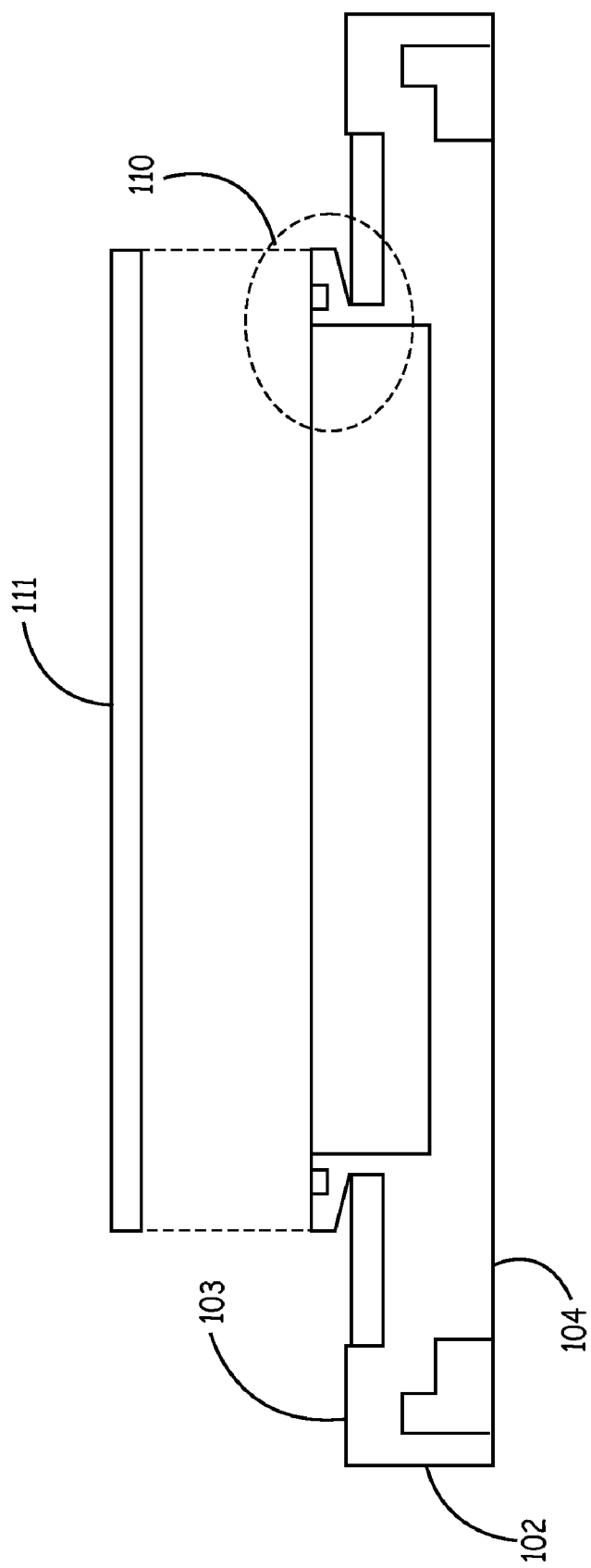
Figure 1F:
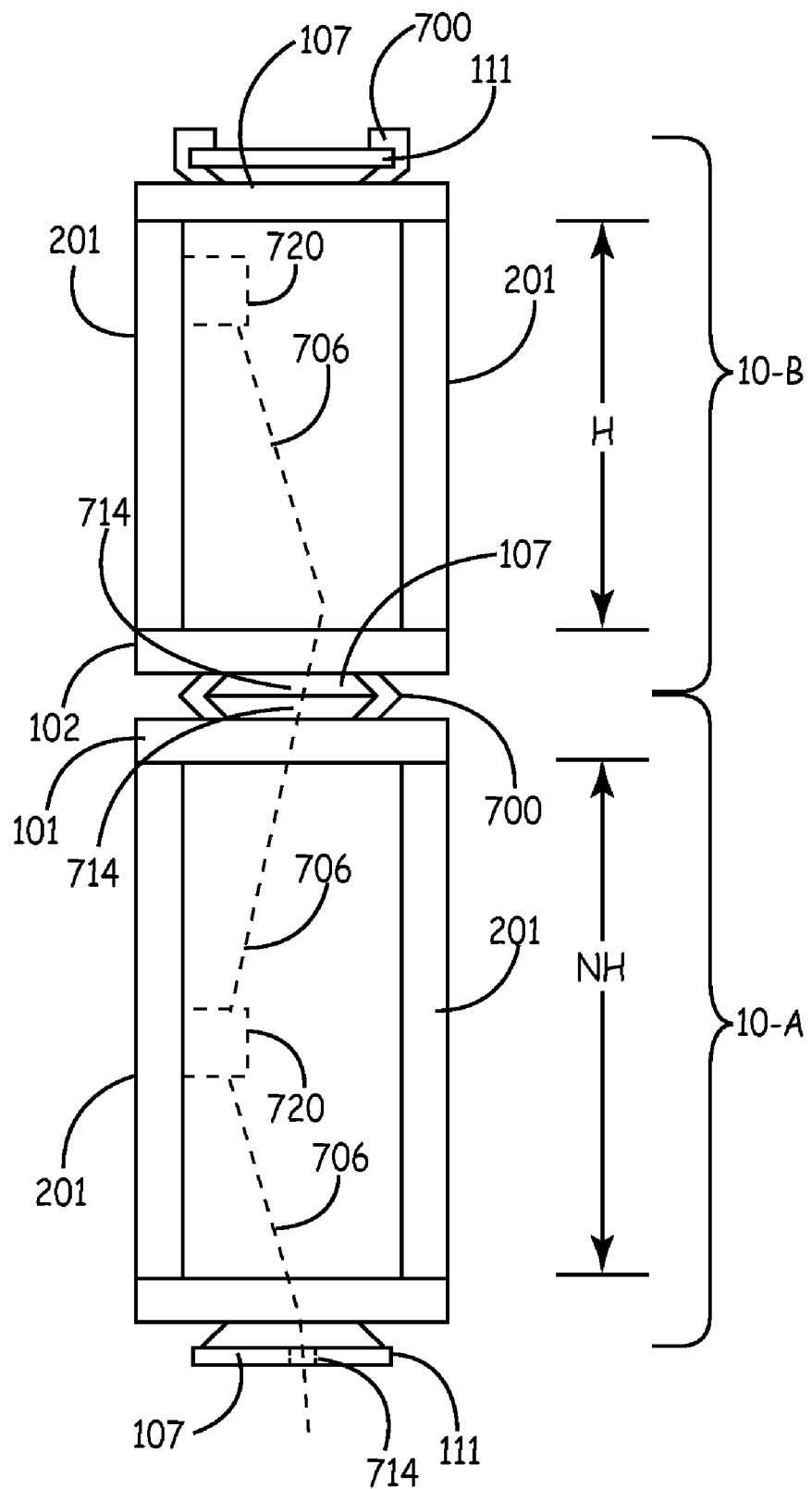
FIG. 1F shows a side view of two enclosure frames stacked on top of one another in accordance with the present invention.

FIGS. 1A-1C and 1E show views of one embodiment of an endplate 101 in accordance with the present invention. FIG. 1D shows a side view of one embodiment of an enclosure frame 10 in accordance with the present invention. FIG. 1F shows a side view of two enclosure frames 10 stacked on top of one another in accordance with the present invention. The endplate 101 is also referred to herein as "top endplate 101." The endplate 102 is also referred to herein as "bottom endplate 102." The top and bottom endplates 101 and 102 are substantially the same in structure. Each endplate 101 and 102 comprises an outer surface 103, an inner surface 104 opposing the outer surface, and four side surfaces 105. Each of the endplates 101 and 102 contains at least one channel 106. The channel 106 extends from a first portion represented generally at 112-A (FIG. 1B) of an edge 113 to a second portion represented generally at 112-B of the edge 113. The edge 113 is formed between inner surface 104 and the respective side surface 105.

The endplates 101 and 102 also contain a V-band flange port 107. In one implementation, the V-band flange port 107 is a circular hole extending through the endplates 101 and 102 from the outer surface 103 to the inner surface 104. The V-band flange port 107 has a flange represented generally at 110 (FIG. 1B) on the outer surface 103 that surrounds the hole. In another implementation, the shape of the hole in the V-band flange port 107 is elliptical. The endplates 101 and 102 also contain a plurality of through holes 108 configured to accept screws. The through holes 108 extend from the outer surface 103 to the inner surface 104.

The channel 106 is configured to hold a continuous seal 109. The channels 106 in the endplate 101 and 102 are designed to match up with the channels in the various supporting structures so that the channel surfaces are approximately flush at the interfaces between the endplates 101 and 102 and supporting structures. When the enclosure is assembled, the continuous seal 109 is placed in the channels (FIG. 1D). The openings 212 (FIG. 1D) that are formed by the endplates 101, 102, and extruded pillars 201 are covered by panels or doors to form a weather resistant housing for any electronic component inside the enclosure frame 10 (FIG. 1D).

The V-band flange ports 107 can be used to attach enclosure frames 10 to one another. In order to attach one enclosure frame 10 to another, a V-band clamp 700 (FIG. 1F) attaches a V-band flange port 107 of a top endplate 101 of a bottom enclosure frame 10-A to a V-band flange port 107 of a bottom endplate 102 of a top enclosure frame 10-B. Thus, two enclosure frames 10-A and 10-B are stacked on top of one another. A bulkhead connector plate 111 (FIG. 1E) is attached to the V-band flange port 107 of an endplate 101 and/or 102 when the V-band flange port 107 is not clamped to another V-band flange port 107 located in another endplate 101 or 102. The two enclosures frames 10-A and 10-B can be of different heights, seen in FIG. 1F as H and NH. In one embodiment, the two enclosure frames 10-A and 10-B can be of different sizes.

The two enclosure frames 10-A and 10-B can be the same height. The bulkhead connector plate 111 can be attached any number of ways to the endplate 101/102, including welding, attaching the bulkhead connector plate 111 to a flange (not shown) that edges the inside of the V-band flange port 107, using a V-band clamp 700 to clamp the bulkhead connector plate 111 to the flange 110 of endplate 101/102, and screwing the bulkhead connector plate 111 into the endplate 101/102. In one implementation, the bulkhead connector plate 111 has at least one plug hole 714 for a bulkhead connector or a cable 706 that are connected to the electronic components 720 in the enclosure frames 10. Examples of bulkhead connectors include BNC connectors, coaxial cables, and SMA connectors.

Figure 2A:
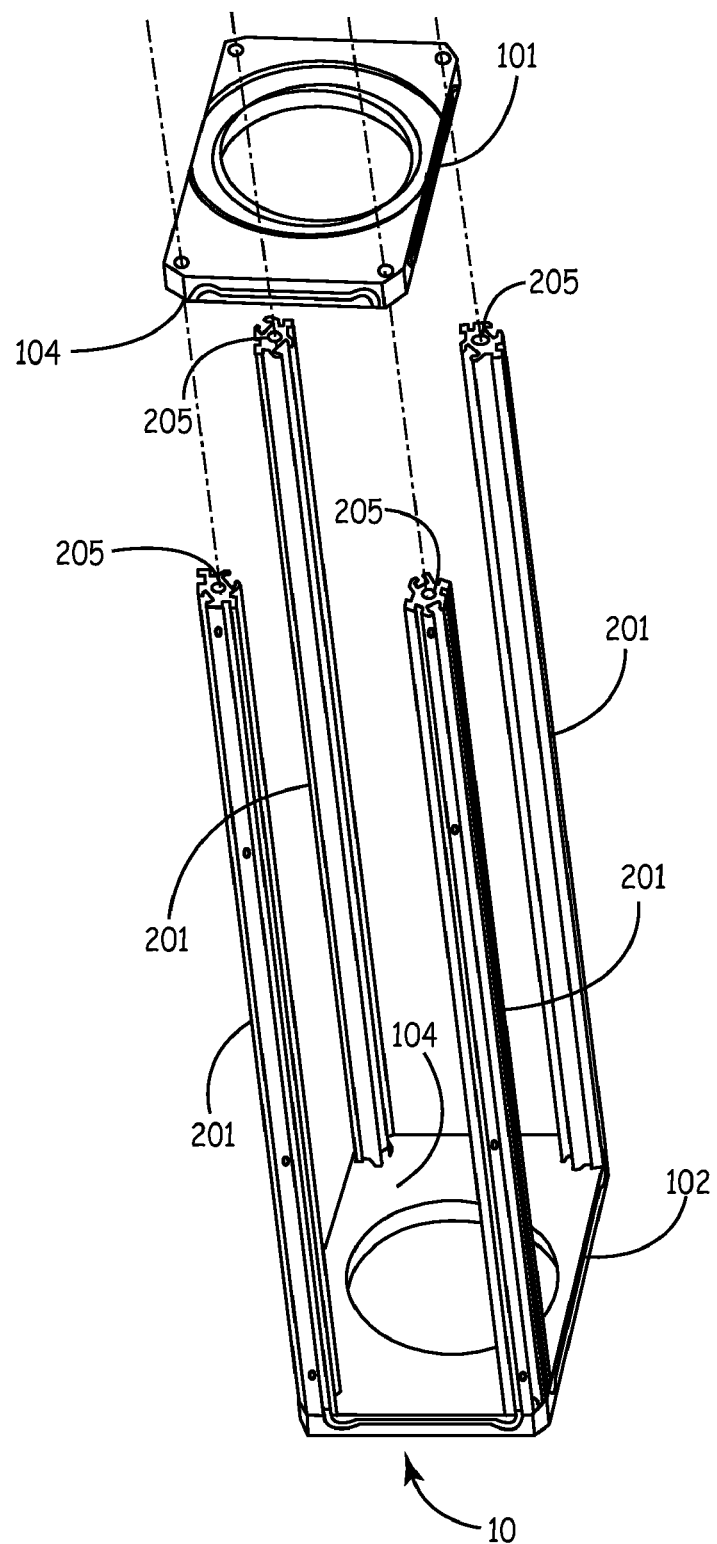
FIGS. 2A-2E show views of an embodiment of an enclosure frame or portions of the enclosure frame in accordance with the present invention.
Figure 2B:
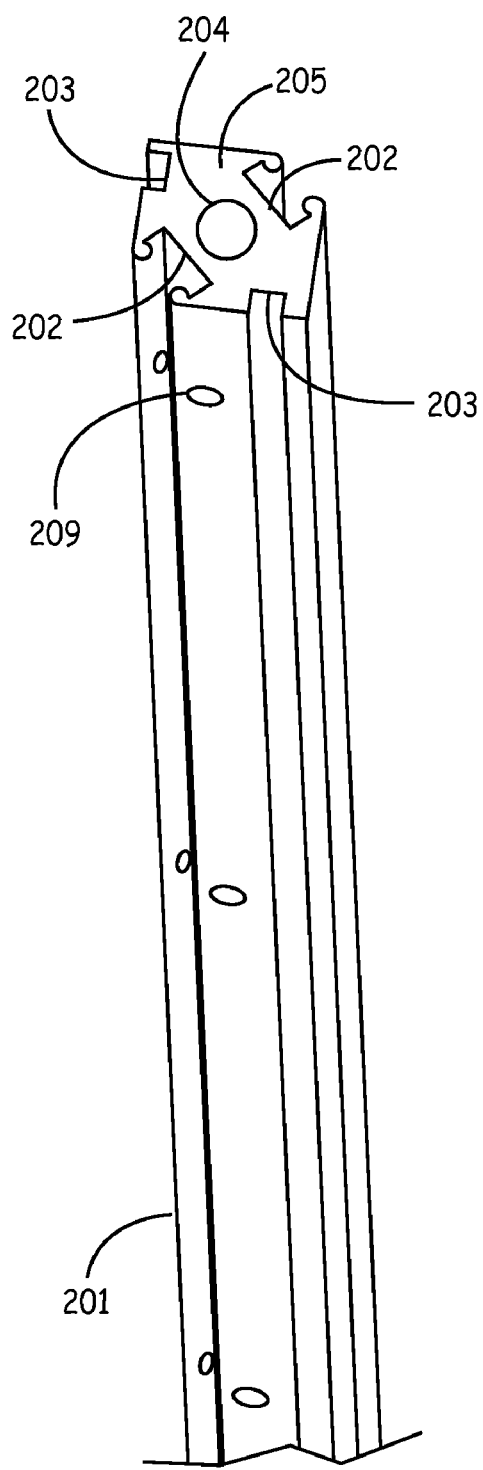
Figure 2C:
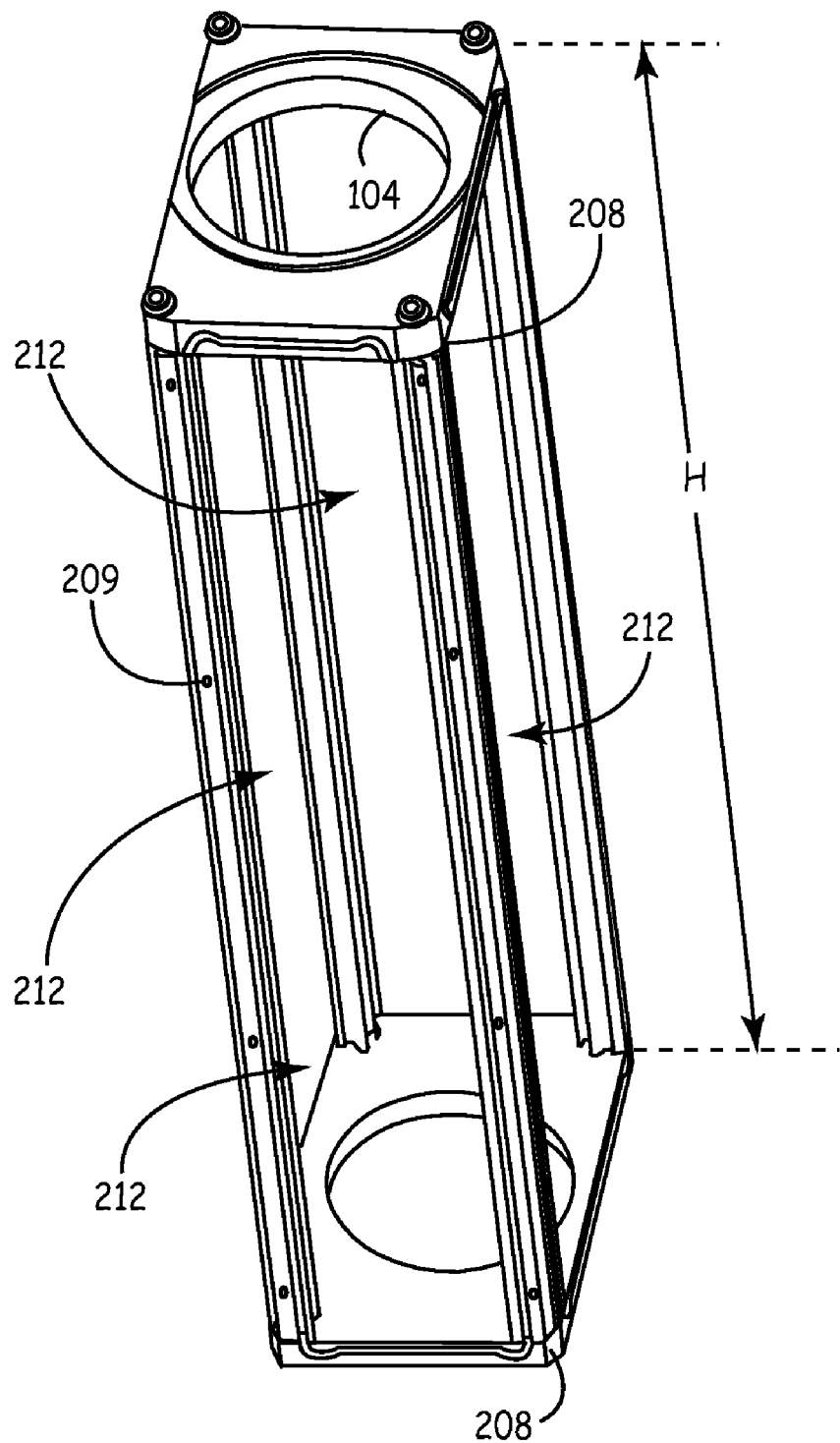
Figure 2D:
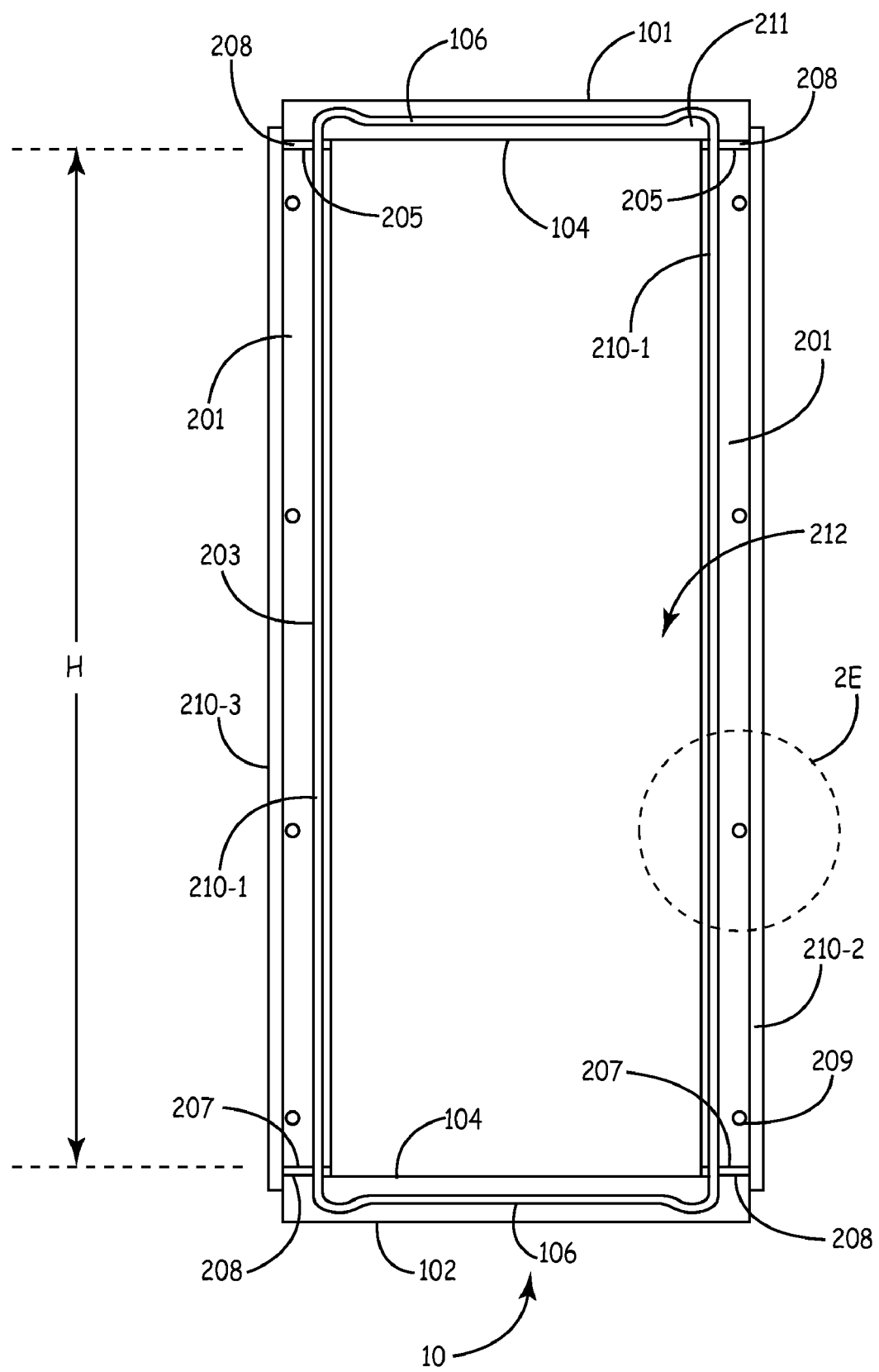
Figure 2E:
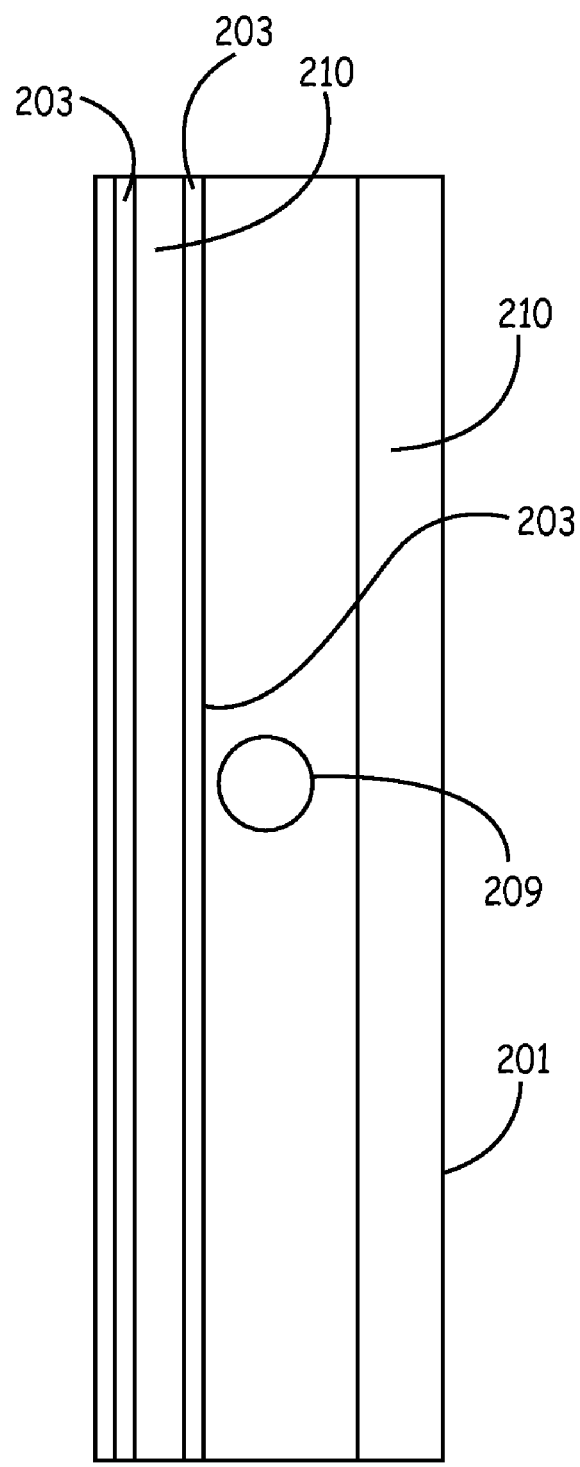

FIGS. 2A-2E show views of an embodiment of an enclosure frame 10 or portions of the enclosure frame 10 in accordance with the present invention. FIG. 2A is an exploded view of the embodiment of the enclosure frame 10 utilizing four extruded pillars 201 as supporting structures. FIG. 2B is an enlarged view of an end surface 205 of one of the pillars 201. FIG. 2C is a view of the embodiment of the enclosure frame 10 utilizing four extruded pillars 201 as supporting structures. FIG. 2D is a side view of the enclosure frame 10 utilizing four extruded pillars 201 as supporting structures. FIG. 2E is an enlarged side view of a portion of extruded pillar 201 with a continuous seal 210 inserted into the channel 203.

The extruded pillars 201 are attached to inner surface 104 of the top endplate 101 and inner surface 104 of the bottom endplate 102. Each of the extruded pillars 201 contains at least one T-slot 202, at least one channel 203, at least one screw hole 204 (FIG. 2B) on first end surface 205 and at least one screw hole (not visible) on second end surface 207 (FIG. 2D). The T-slot 202 and channel 203 extend the length (FIGS. 2C-2D) of the extruded pillar 201. The second end surface 207 and first end surface 205 (FIG. 2D) oppose each other and are substantially the same in structure and function. The four pillars 201 in the enclosure frame 10 are all cut to about the same length. The pillars 201 of other embodiments of enclosure frame 10 can be cut to shorter or longer lengths. In one implementation of this embodiment, there are no T-slots 202 in the extruded pillars 201.

Once the enclosure frame 10 is assembled, a continuous channel 211 (FIG. 2D) is formed by the channels 106 in the endplates 101 and 102 and the channels 203 of the two extruded pillars 201. A continuous seal 210 is inserted into channels 203. In this manner, the opening 212 is framed by the continuous seal 210 in the continuous channel 211 (FIG. 2D). As shown in FIG. 2D, there are three continuous seals 210(1-3) framing three respective openings 212. The continuous seal 210-1 is seen in a front view, while the continuous seals 210-2 and 210-3 are seen in a side view in FIG. 2D.

In one implementation of this embodiment, the continuous seal 210 is an O-ring. In another implementation, the O-ring is a solid rubber elastomer O-ring. In yet another implementation, the O-ring is a hollow O-ring. In another implementation of this embodiment, the continuous seal 210 is a C-shaped seal. In other implementations of this embodiment, the continuous seal 210 can be a die cut foam, a solid piece having a circular cross section, a solid piece having a D-shaped cross section, a hollow piece having an annular cross section, a foam piece having a circular cross section, a foam piece having a D-shaped cross section, and combinations thereof. In another implementation, the continuous seal comprises a rubber or foam material applied as a liquid.

The T-slot 202 is used for mounting internal and/or external components. In one implementation, the external components comprise door hinges.

As shown in FIG. 2D, an adhesive and/or sealant 208 is located in between the top endplate 101 and the first end surface 205 of the pillars 201. Adhesive and/or sealant 208 is also located between the bottom endplate 102 and the second end surface 207 of the pillars 201. The adhesive and/or sealant 208 joins and seals the interfaces between the end faces 205 and 207 of the extruded pillars 201 and the inner surfaces of the inner surface 104 of the respective top and bottom endplates 101 and 102. Side screw holes, one of which is represented by 209, are located on the pillars 201 for attaching panels or doors (not shown). When the extruded pillars 201 and endplates 101 and 102 are assembled, the enclosure frame 10 is formed to house electronic components. Panels or doors are then attached to cover the openings by inserting screws into the side screw holes 209. In one implementation, panels or doors are attached to endplates 101 and 102 via screw holes located on side surfaces 105. When the panels or doors are attached to the enclosure frame 10, the continuous seal 210, endplates 101 and 102, extruded pillars 201, adhesive and/or sealant 208, and panels or doors combine to form a weather resistant enclosure. Other mechanisms to attach panels to the enclosure frame to cover openings are possible.

Figure 3A:
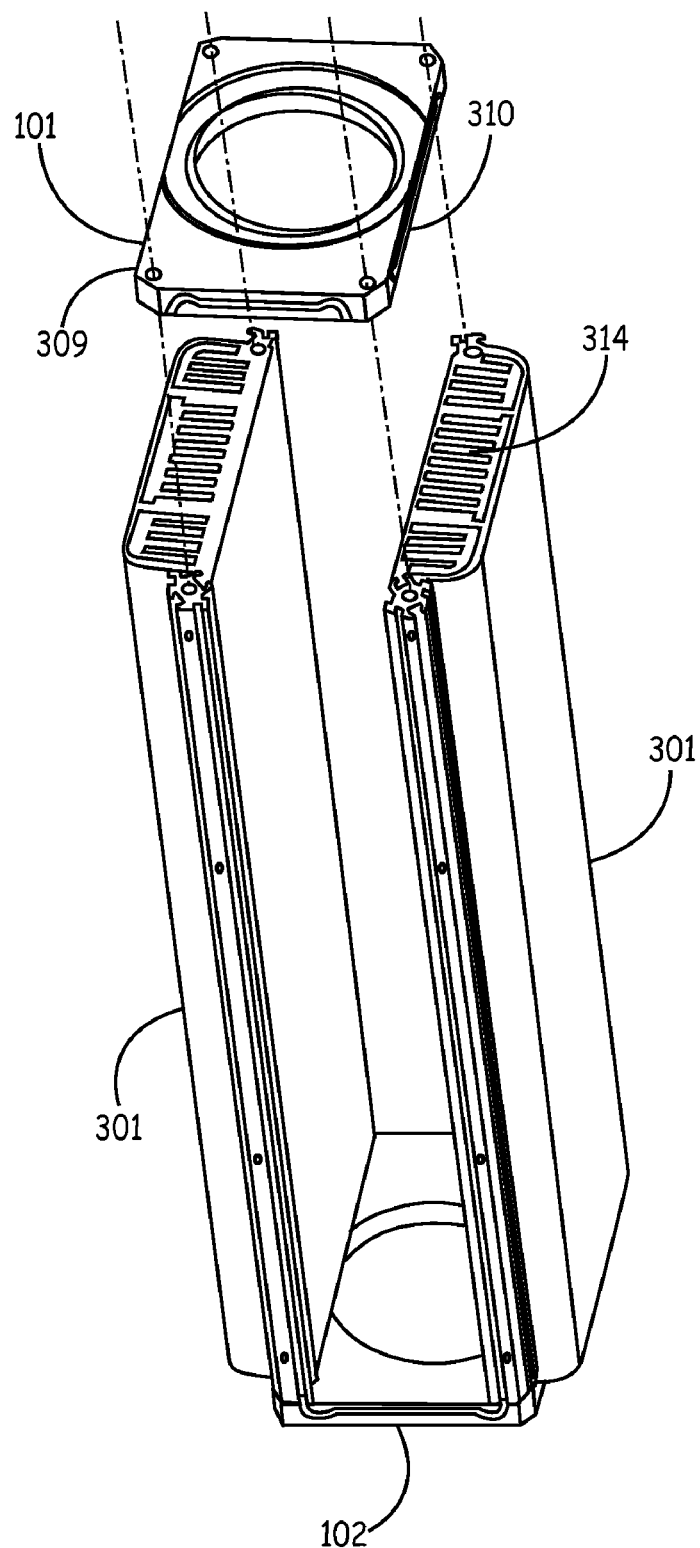
FIGS. 3A-3D show views of an embodiment of an enclosure frame or portions of the enclosure frame in accordance with the present invention.
Figure 3B:
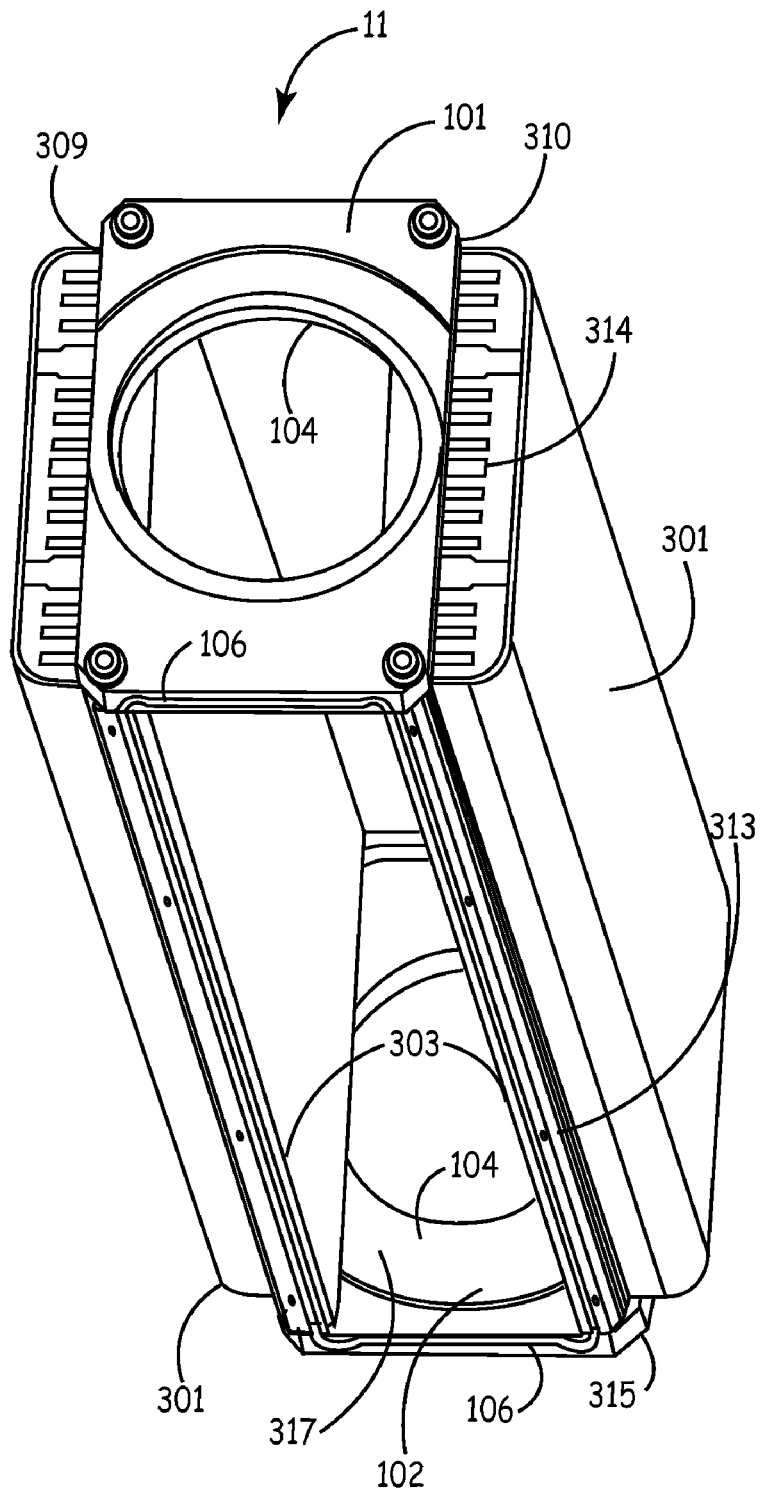
Figure 3C:
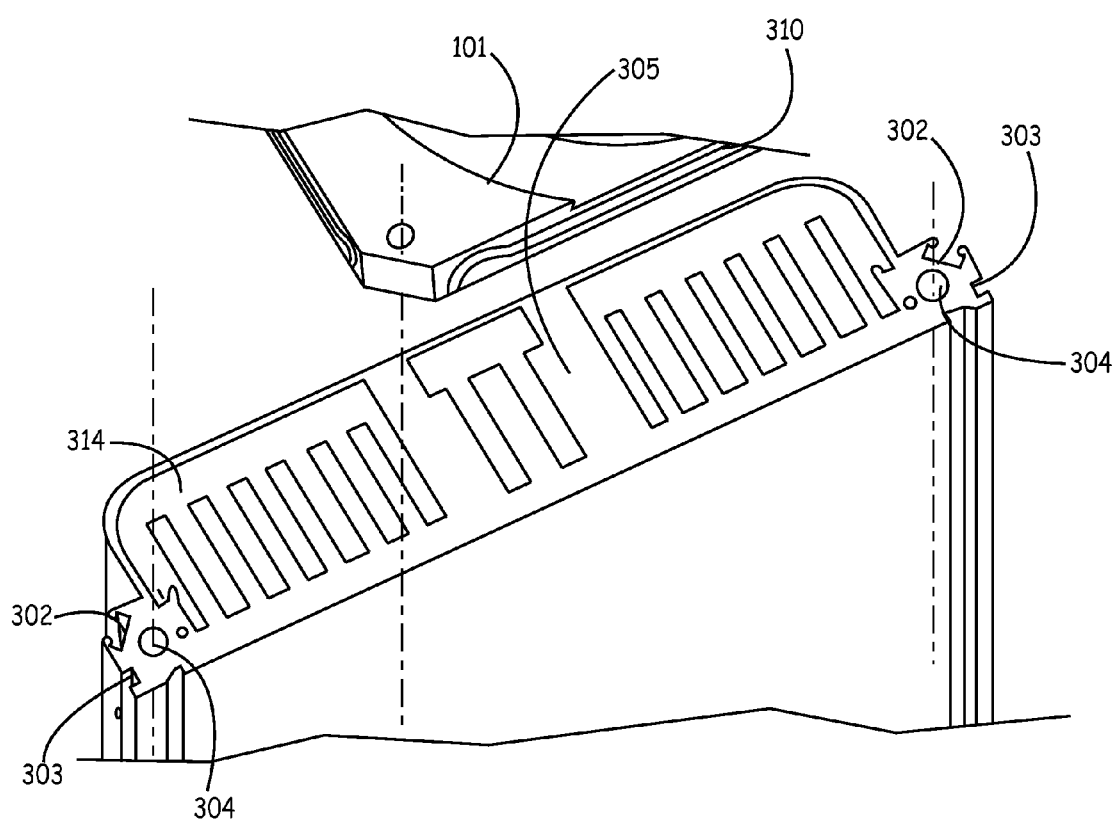
Figure 3D:
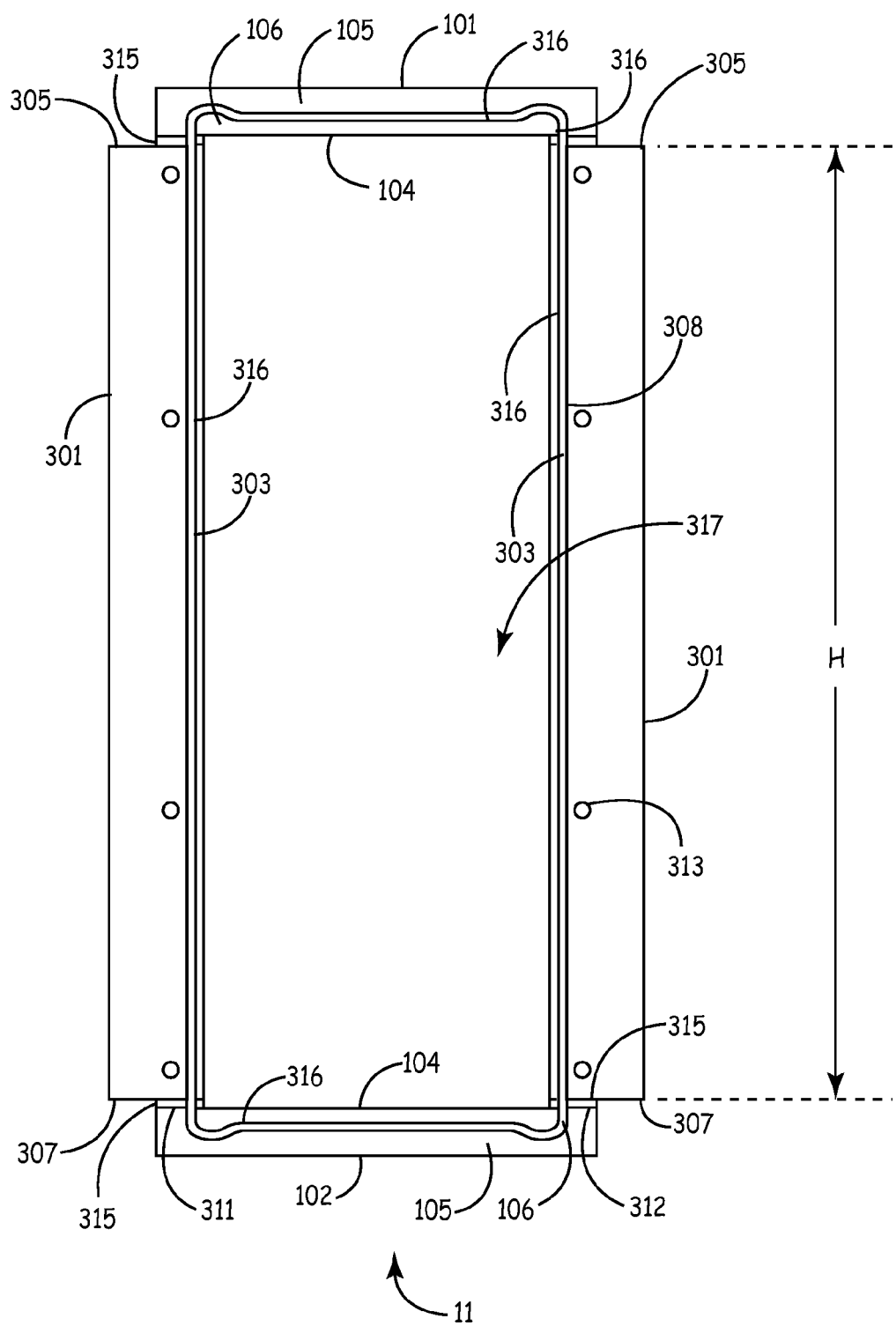

FIGS. 3A-3D show views of an embodiment of an enclosure frame 11 or portions of the enclosure frame 11 in accordance with the present invention. FIG. 3A is an exploded view of the embodiment of the enclosure frame 11 utilizing two extruded walls 301 as supporting structures. FIG. 3B is a view of the embodiment of the enclosure frame 11 utilizing two walls 301 as supporting structures. FIG. 3C is an enlarged view of an end surface 305 of an extruded wall 301. FIG. 3D is a side view of the embodiment of the enclosure frame 11.

The two walls 301 are attached to opposing edges 309 and 310 of the inner surface 104 of the top endplate 101 and opposing edges 311 and 312 (FIG. 3D) of the inner surface 104 of the bottom endplate 102. Each of the extruded walls 301 contains at least one T-slot 302, at least one channel 303, two screw holes 304 on a first end surface 305 (FIG. 3C) and two screw holes (not visible) on a second end surface 307 (FIG. 3D). The T-slot 302 and channel 303 extend the length H of the extruded walls 301. The second end surface 307 and first end surface 305 (FIG. 3D) oppose each other and are substantially the same in structure and function. The endplate 101 and 102 are screwed to the extruded walls 301. In one implementation, the endplates 101 and 102 are attached to the extruded walls 301 by mechanical fixtures other than screws. In one implementation of this embodiment, there are no T-slots 302 in the walls 301.

Once the enclosure frame 11 is assembled, a continuous channel 316 is formed by the channels 106 in the endplates 101 and 102 and the channels 303 of the two extruded walls 301. A continuous seal 308 is inserted into the continuous channel 316. In this manner, the opening 317 is framed by the continuous seal 308 (FIG. 3D) in continuous channel 316. The continuous seal 308 is similar in form and function to continuous seal 210. An adhesive and/or sealant 315 is located in between the top endplate 101 and first end surface 305 of the extruded walls 301. Adhesive and/or sealant 315 is also located between the bottom endplate 102 and the second end surface 307 of the extruded walls 301. Side screw holes, one of which is represented by 313, are located on the extruded walls 301 for attaching panels or doors (not shown). When side walls 301 and endplate 101 and 102 are assembled, an enclosure frame 11 is formed to house electronic components. Panels or doors are then attached over openings 317 to the enclosure frame 11 by screws screwed into the side screw holes 313. In one implementation, panels or doors are attached to endplates 101 and 102 via screw holes located on side surfaces 105. Heat fins 314 (FIGS. 3A-3C) are located on the extruded walls 301 in order to dissipate heat and serve mechanical needs. In another embodiment, there are no heat fins 314 on the extruded walls 301. When the panels or doors are attached to the enclosure frame 11, the continuous seal 308, endplates 101 and 102, walls 301, adhesive and/or sealant 315, and panels or doors combine to form a weather resistant enclosure. In one implementation, the panels or doors that cover openings 317 are attached to the enclosure frame 11 by some mechanical fixture other than screws.

Figure 4A:
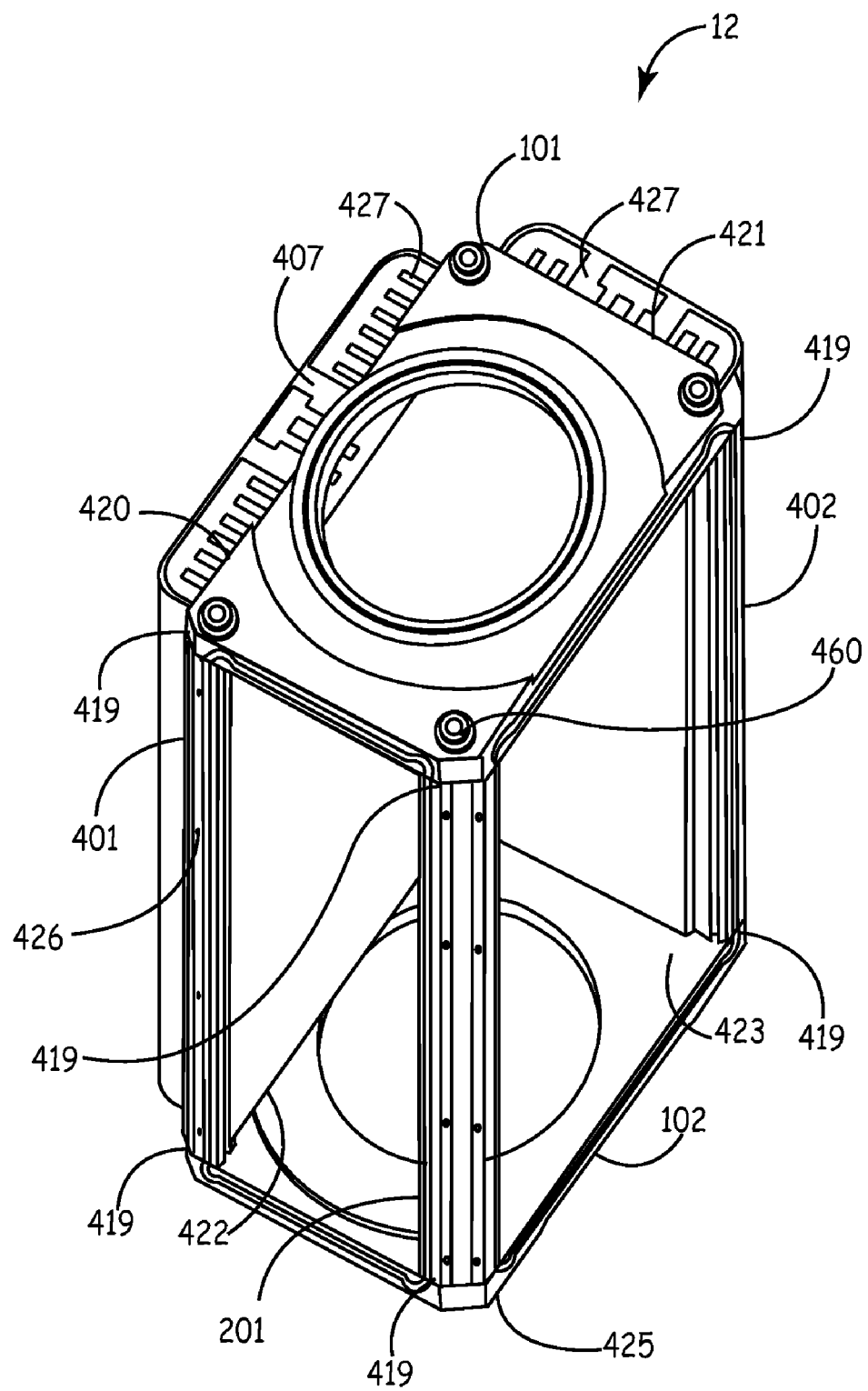
FIGS. 4A-4C show views of an embodiment of an enclosure frame in accordance with the present invention.
Figure 4B:
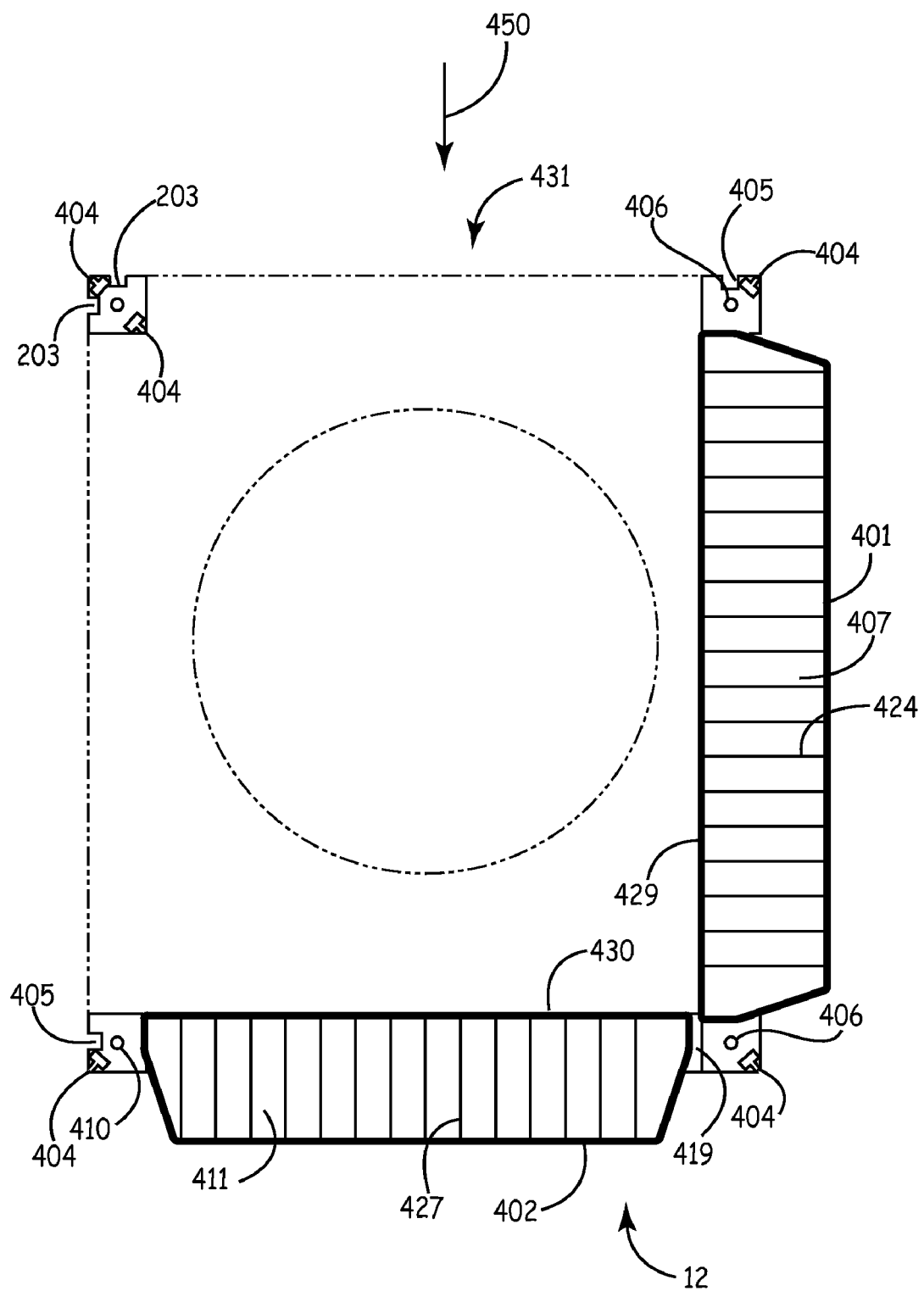
Figure 4C:
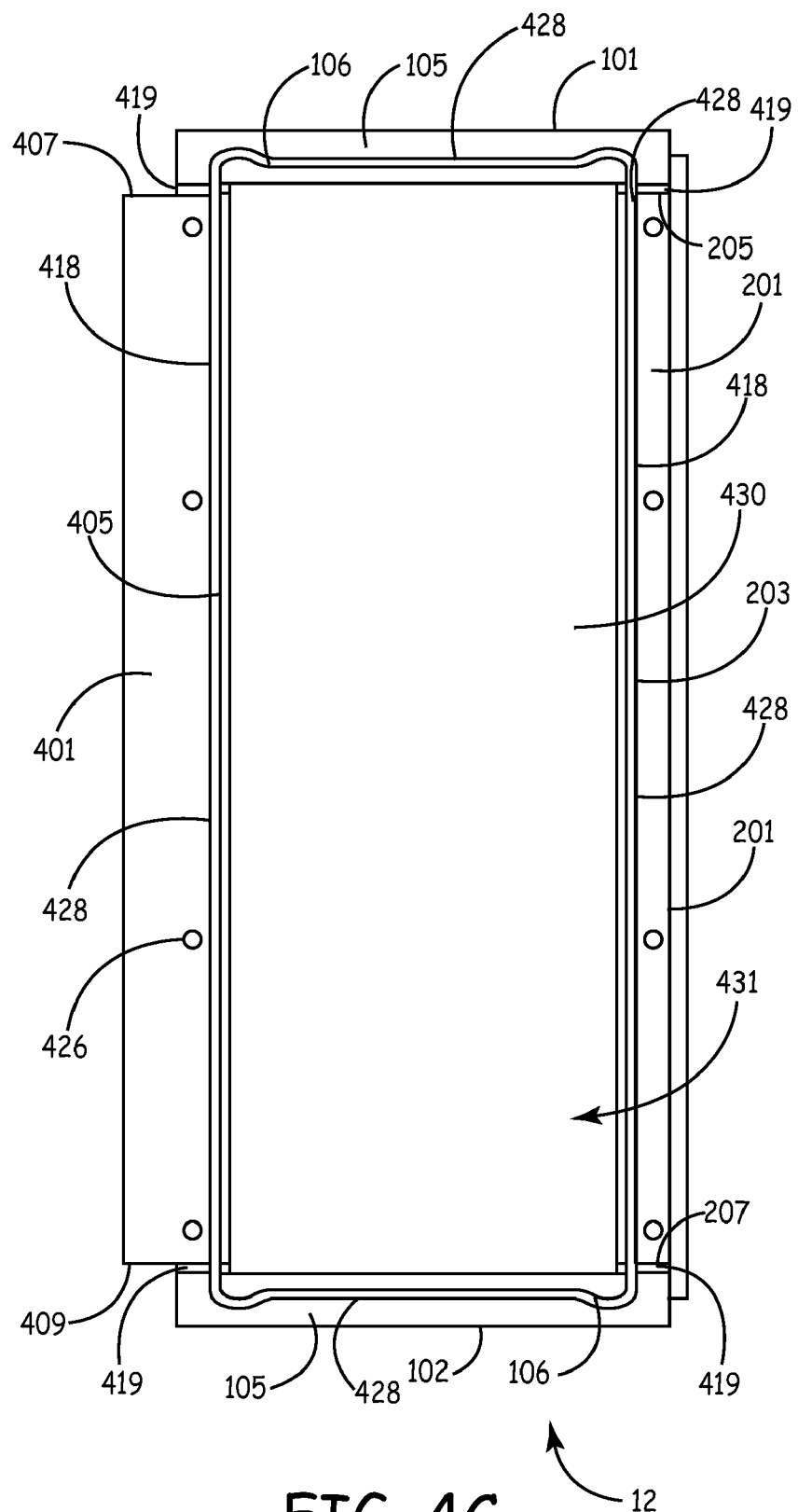

FIGS. 4A-4C show views of an embodiment of an enclosure frame 12 or portions of the enclosure frame 12 in accordance with the present invention. FIG. 4A is an assembled view of the embodiment of the enclosure frame 12 utilizing two extruded walls 401 and 402 as well as an extruded pillar 201 as supporting structures. FIG. 4B is a top view of the two extruded walls 401 and 402 and extruded pillar 201. FIG. 4C is a side view of the embodiment of the enclosure frame 12 as viewed from the direction of arrow 450 in FIG. 4B.

The two extruded walls 401 and 402 and pillar 201 are attached to adjoining edges 420 and 421 (FIG. 4A) of the inner surface 104 of the top endplate 101. The two extruded walls 401 and 402 are attached to the adjoining edges 422 and 423 of the inner surface 104 of the bottom endplate 102. In this manner the inner surface 429 of wall 401 is perpendicular to inner surface 430 of wall 402. Each of the extruded walls 401 and 402 contain at least one T-slot 404 and at least one channel 405. Extruded wall 401 contains two screw holes 406 on a first end surface 407 (FIG. 4B) and two screw holes (not visible) on a second end surface 409 (FIG. 4C). The T-slot 404 and channel 405 extend the length of the extruded walls 401 and 402. Extruded pillar 201 is described above with reference to FIG. 2B. The second end surface 409 and the first end surface 407 of extruded wall 401 oppose each other and are substantially the same in structure and function.

Extruded wall 402 contains at least one screw hole 410 on a first end surface 411, at least one screw hole (not visible) on a second end surface (not shown). The second end surface (not shown) and the first end surface 411 oppose each other and are substantially the same in structure and function. The endplates 101 and 102 are screwed to the extruded walls 401 and 402 and the pillar 201. In one implementation, the endplates 101 and 102 are attached to the extruded walls 401 and 402 and the pillar 201 by mechanical fixtures other than screws. In one implementation of this embodiment, there are no T-slots 404 in the extruded walls 401 and 402 and extruded pillar 201.

Once the enclosure frame 12 is assembled, a continuous channel 428 (FIG. 4C) is formed by the channels 106 in the endplates 101 and 102, the channel 405 of the extruded wall 401 and the channel 203 of the extruded pillar 201. A continuous seal 418 is inserted into channel 203. In this manner, the opening 431 is framed by the continuous seal 418 in continuous channel 428. The continuous seal 418 is similar in form and function to continuous seal 210.

An adhesive and/or sealant 419 is located in between top endplate 101 and the top surfaces 407 and 411 of extruded walls 401 and 402 as well as between the top endplate 101 and the first end surface 205 of extruded pillar 201. Adhesive and/or sealant 419 is also located between the bottom endplate 102 and the bottom surfaces 409 of extruded walls 401 and 402, and between the bottom endplate 102 and the second end surface 207 of extruded pillar 201. Adhesive and/or sealant 419 is also located between the two extruded walls 401 and 402 (FIG. 4B). The two walls 401 and 402 are attached on adjoining edges 420 and 421, respectively, of the top endplate 101. The two walls 401 and 402 are attached on adjoining edges 422 and 423, respectively, of the bottom endplate 102 (FIG. 4A).

The extruded pillar 201 is attached at a corner 460 of the top endplate 101 and corner 425 (FIG. 4A) of the bottom endplate 102. The corner 460 opposes the corner formed by the adjoining edges 420 and 421. Likewise, the corner 425 opposes the corner formed by the adjoining edges 422 and 423. Side screw holes, one of which is represented by 426, are located on the extruded walls 401 and 402 for attaching panels or doors. When the two extruded walls 401 and 402, the extruded pillar 201, and the endplates 101 and 102 are assembled, an enclosure 12 is formed to house electronic components. Panels or doors are then attached over opening 431 to the enclosure frame 12 by screws screwed into side screw holes 209 on the extruded pillar 201 and side screw holes 426 of extruded walls 401 and 402. In one implementation, panels or doors are attached to endplates 101 and 102 via screw holes located on side surfaces 105. Heat fins 427 are located on the extruded walls 401 and 402 in order to dissipate heat. In another embodiment, there are no heat fins 427 on the extruded walls 401 and 402. When the panels or doors are attached over opening 431 to the enclosure frame 12, the continuous seal 418 in the continuous channel 428, endplates 101 and 102, extruded wall 401 and 402, extruded pillar 201, adhesive and/or sealant 419, and panels or doors combine to form a weather resistant enclosure.

Figure 5A:
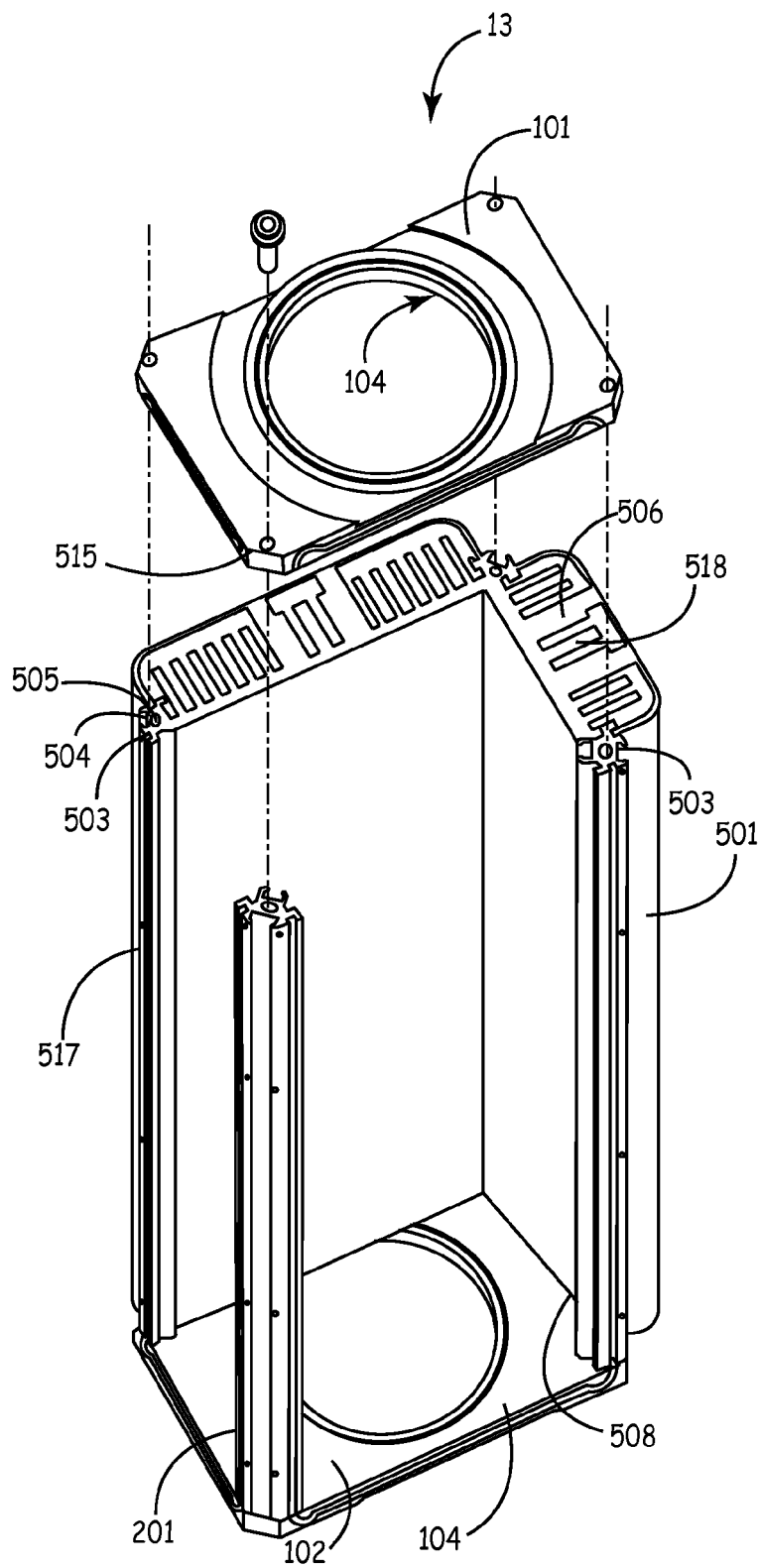
FIGS. 5A-5D show views of an embodiment of an enclosure frame or portions of the enclosure frame in accordance with the present invention.
Figure 5B:
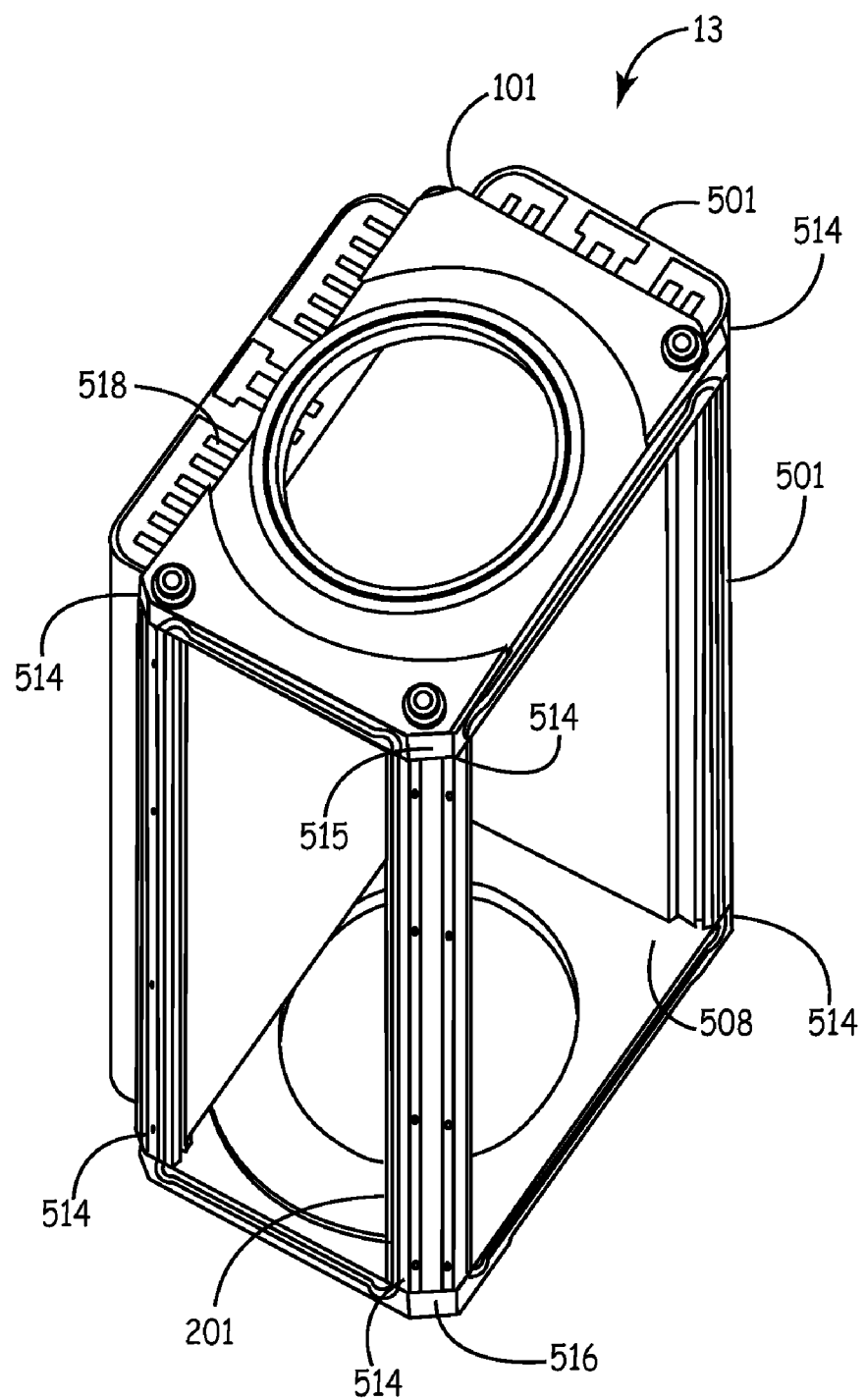
Figure 5C:
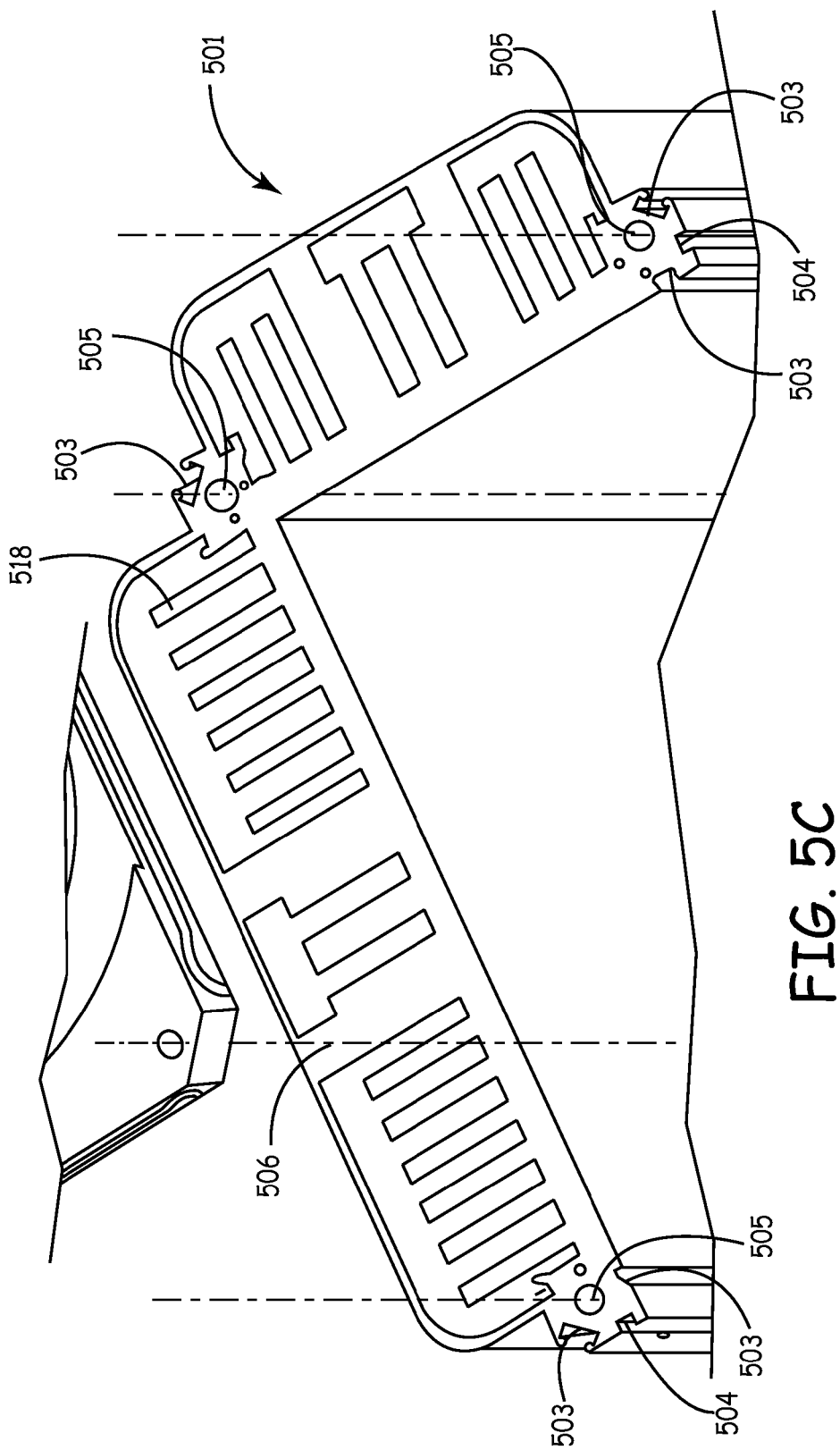
Figure 5D:
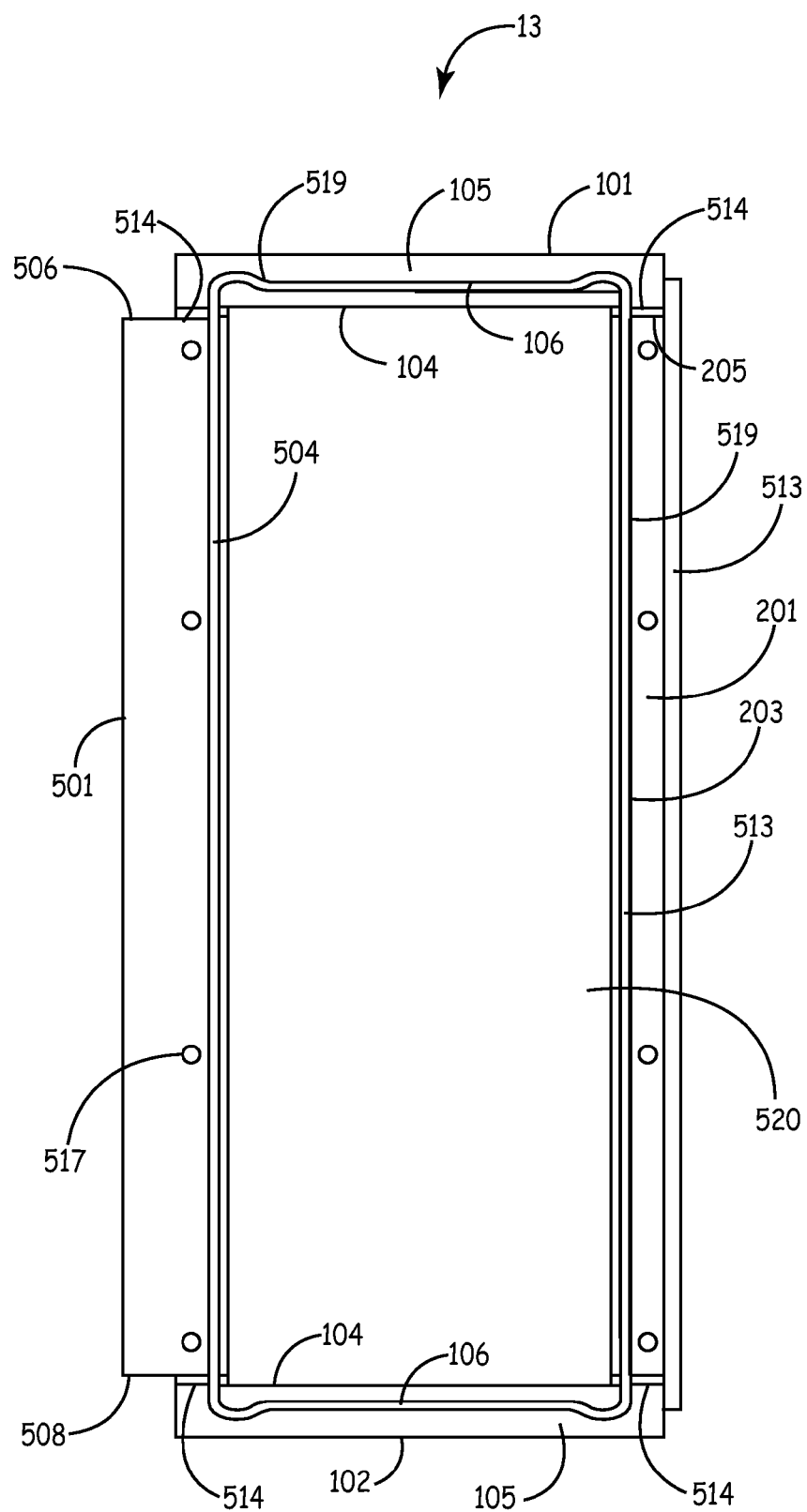

FIGS. 5A-5D show views of an embodiment of an enclosure frame 13 or portions of the enclosure frame 13 in accordance with the present invention. FIG. 5A is an exploded view of the embodiment of the enclosure frame 13 utilizing an L-shaped wall 501 and an extruded pillar 201 as supporting structures. FIG. 5B is a view of the embodiment of the enclosure frame 13 utilizing the L-shaped wall 501 and an extruded pillar 201 as supporting structures. FIG. 5C is an enlarged view of an end surface of the L-shaped wall 501. FIG. 5D is a side view of the embodiment of the enclosure frame 13.

The L-shaped wall 501 and pillar 201 are attached to inner surface 104 of the top endplate 101 and inner surface 104 of the bottom endplate 102. The L-shaped wall 501 contains at least one T-slot 503 and two channels 504. The T-slot 503 and channel 504 extend the length of the L-shaped wall 501. The L-shaped wall 501 contains screw holes 505 on a first end surface 506 (FIG. 5C) and screw holes (not visible) on a second end surface 508 (FIG. 5D). The second end surface 508 and the first end surface 506 oppose each other and are substantially the same in structure and function. In one implementation of this embodiment, there are no T-slots 503 in the L-shaped wall 501 and extruded pillar 201.

Once the enclosure frame 13 is assembled, a continuous channel 519 (FIG. 5D) is formed by the channels 106 in the endplates 101 and 102, channels 504 of the L-shaped wall 501, and channels 203 of extruded pillar 201. A continuous seal 513 is inserted into the continuous channel 519. In this manner, the opening 520 is framed by the continuous seal 513 in continuous channel 519. The continuous seal 513 is similar in form and function to continuous seal 210. An adhesive and/or sealant 514 is located in between the top endplate 101 and the first end surface 506 of the L-shaped wall 501 and between the top endplate 101 and the first end surface 205 of the extruded pillar 201. Adhesive and/or sealant 514 is also located between the bottom endplate 102 and the second end surface 508 of the L-shaped wall 501 and between bottom endplate 102 and the second end surface 207 of the extruded pillar 201 (FIG. 5D). The extruded pillar 201 is attached at corner 515 (FIGS. 5A and 5B) of the top endplate 101 and corner 516 of the bottom endplate 102. The extruded pillar 201 opposes the 90 degree corner of the L-shaped wall 501. Side screw holes, one of which is represented by 517, are located on the L-shaped wall 501 for attaching panels or doors. When the L-shaped wall 501, pillar 201, and endplates 101 and 102 are assembled, an enclosure frame 13 is formed to house electronic components. Panels or doors are then attached over openings 520 to the side screw holes 517 and 209 of extruded pillar 201. In one implementation, panels or doors are attached to endplates 101 and 102 via screw holes located on side surfaces 105. Heat fins 518 are located on the L-shaped wall 501 in order to dissipate heat. In another embodiment, there are no heat fins 518 on the L-shaped wall 501. When the panels or doors are attached to enclosure frame 13, the continuous seal 513, endplates 101 and 102, L-shaped wall 501, extruded pillar 201, adhesive and/or sealant 514 and panels or doors combine to form a weather resistant enclosure.

Figure 6A:
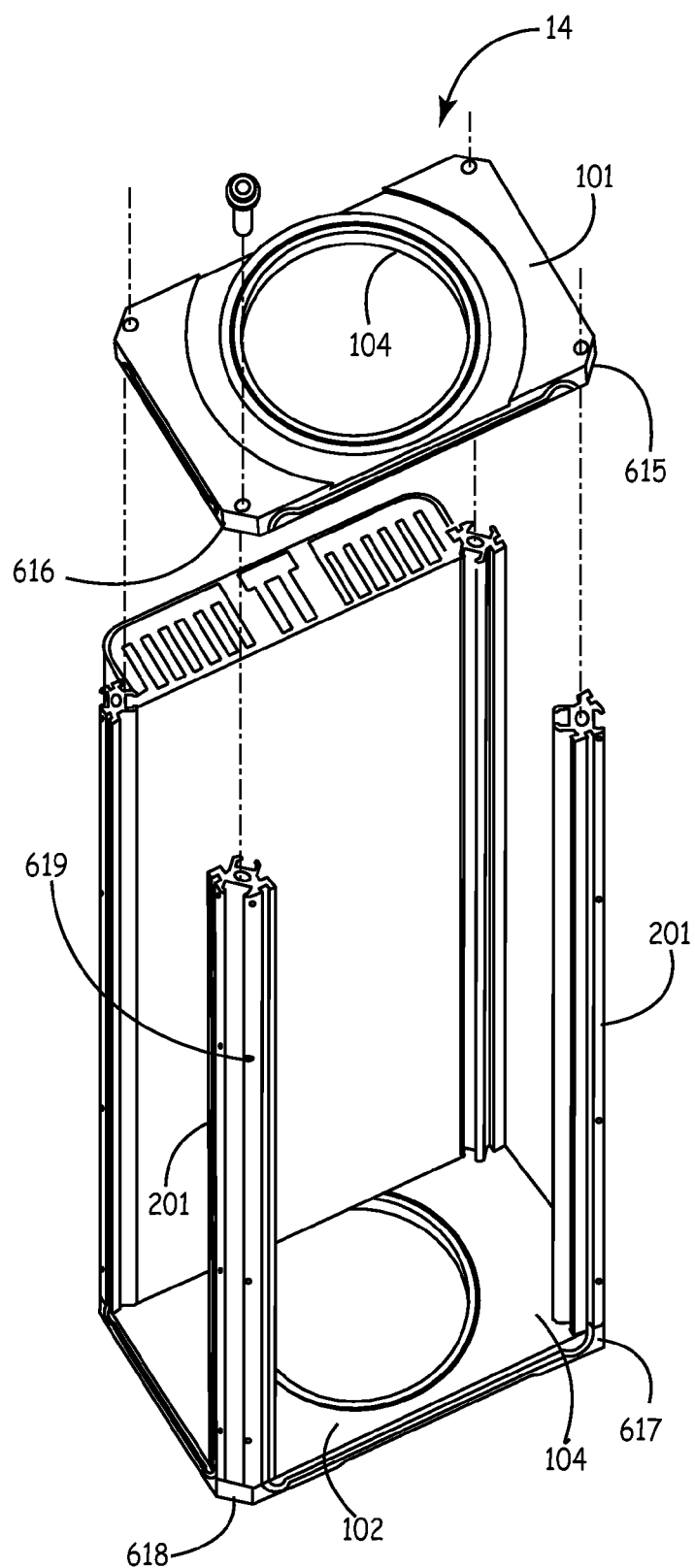
FIGS. 6A-6D show views of an embodiment of an enclosure frame or portions of the enclosure frame in accordance with the present invention.
Figure 6B:
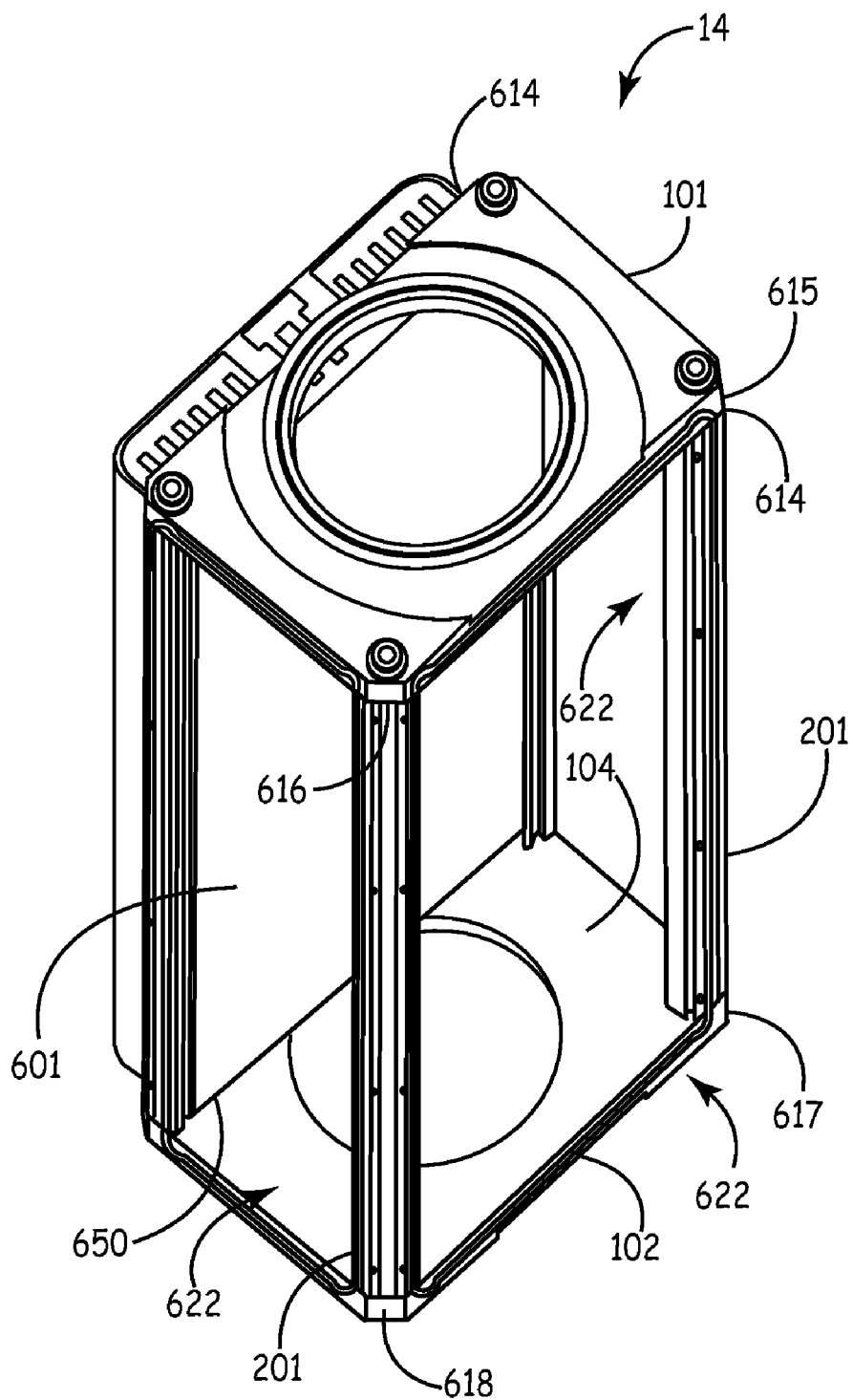
Figure 6C:
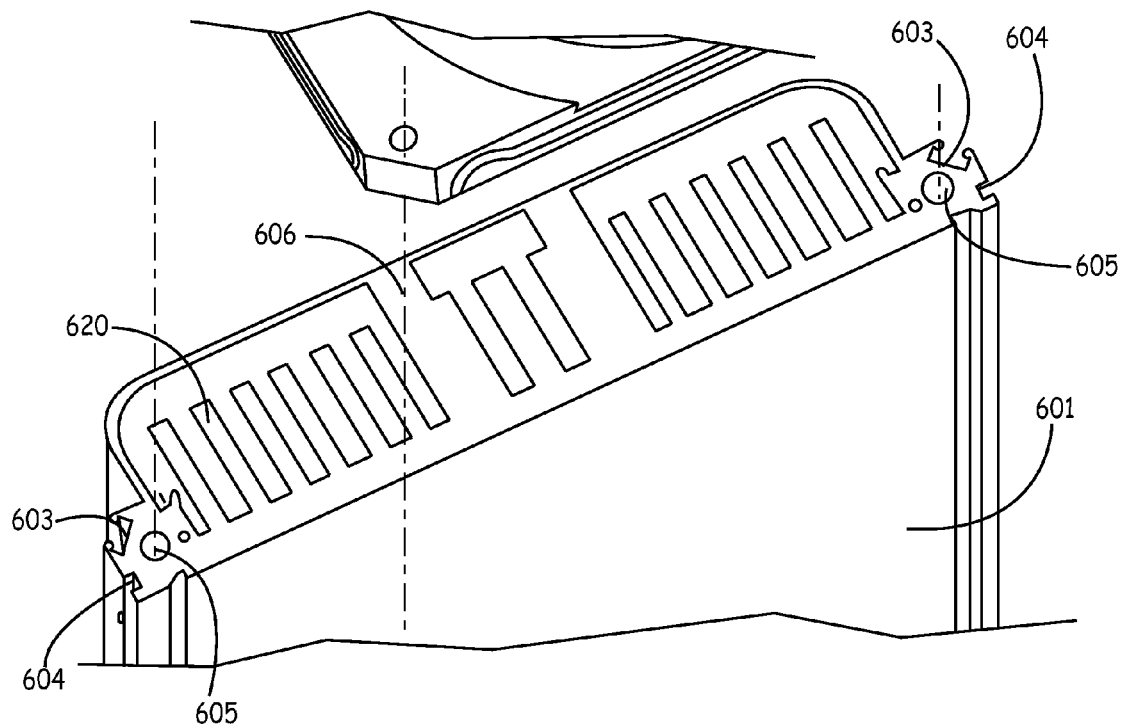
Figure 6D:
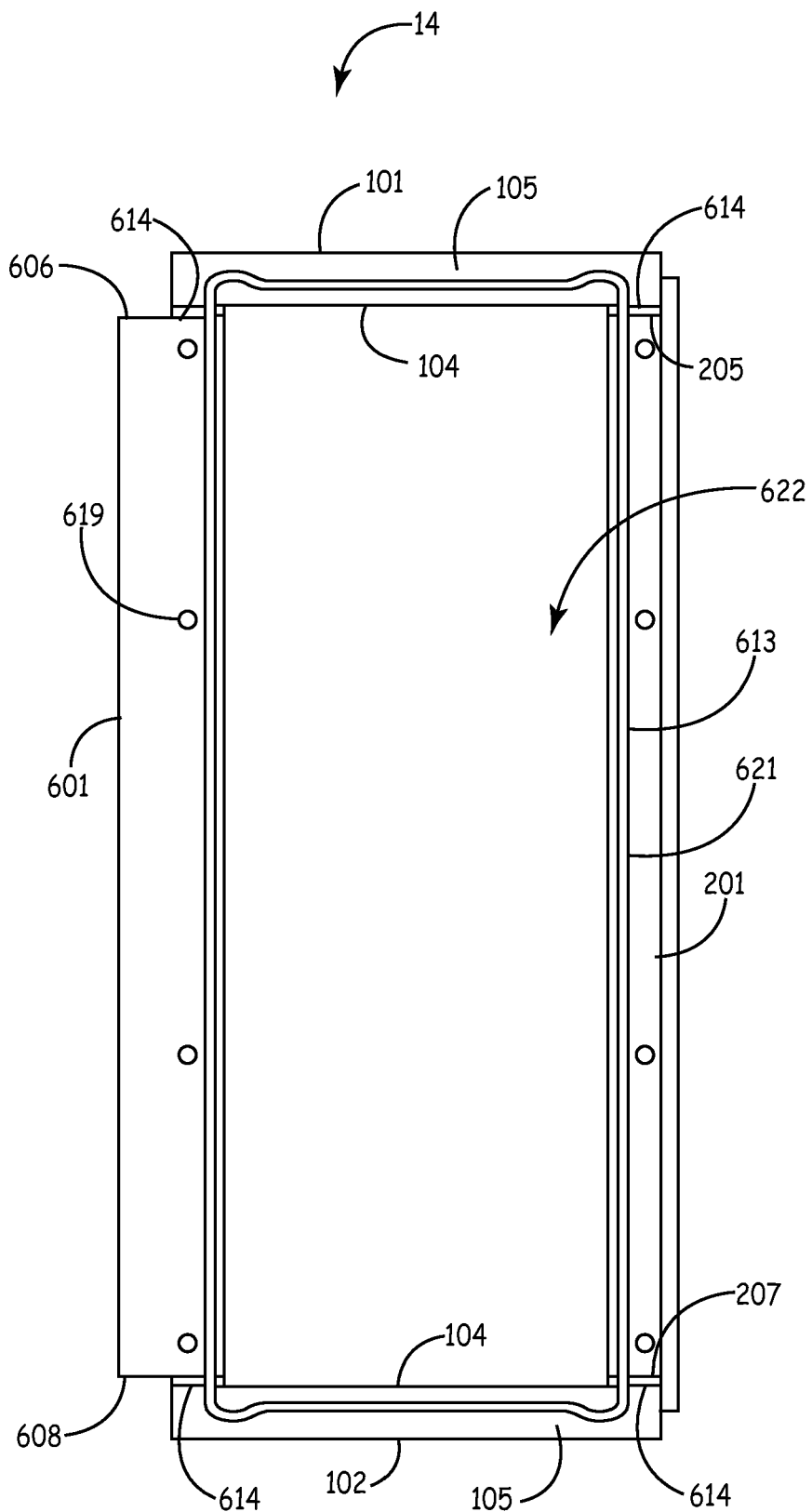

FIGS. 6A-6D show views of an embodiment of an enclosure frame 14 or portions of the enclosure frame 14 in accordance with the present invention. FIG. 6A is an exploded view of the embodiment of the enclosure frame 14 utilizing an extruded wall 601 and two extruded pillars 201 as supporting structures. FIG. 6B is a view of the enclosure frame 14 utilizing the extruded wall 601 and two extruded pillars 201 as supporting structures. FIG. 6C is an enlarged view of an end surface of the extruded wall 601. FIG. 6D is a side view of the embodiment of the enclosure frame 14.

The extruded wall 601 and two extruded pillars 201 are attached to inner surface 104 of the top endplate 101 and inner surface 104 of the bottom endplate 102. The extruded wall 601 contains at least one T-slot 603 and at least one channel 604. The T-slot 603 and channel 604 extend the length of the extruded wall 601 and extruded pillars 201. The extruded wall 601 contains screw holes 605 on a first end surface 606 (FIG. 6C) and screw holes (not shown) on a second end surface 608. The second end surface 608 and the first end surface 606 oppose each other and are substantially the same in structure and function. Extruded pillar 201 is described above in reference to FIG. 2B. In one implementation of this embodiment, there are no T-slots 603 in the extruded wall 601 and two extruded pillars 201.

Once the enclosure frame 14 is assembled, a continuous channel 621 (FIG. 6D) is formed by the channels 106 in the endplates 101 and 102, the channels 203 of the two extruded pillars 201 and channels 604 the extruded wall 601. The opening formed by the pillar 201 is framed by a continuous channel formed by channels 106 in endplates 101 and 102 and by channels 203 of pillar 201. A continuous seal 613 is inserted into continuous channel 621. In this manner, the opening 622 D (FIG. 6D) is framed by the continuous seal 613 in continuous channel 621. The continuous seal 613 is similar in form and function to continuous seal 210. An adhesive and/or sealant 614 is located in between the top endplate 101 and the first end surface 606 of the extruded wall 601 and between the top endplate 101 and the first end surface 205 of the two extruded pillars 201. Adhesive and/or sealant 614 is also located between the bottom endplate 102 and the second end surface 608 of the extruded wall 601 and between the bottom endplate 102 and the second end surface 207 of the two extruded pillars 201. The extruded pillars 201 are attached at corner 615 and 616 (FIGS. 6A and 6B) of the top endplate 101 and corners 617 and 618 of the bottom endplate 102. The corners 617 and 618 oppose the edges 650 of the bottom endplates 102 to which the extruded wall 601 is attached. Side screw holes, one of which is represented by 619, are located on the extruded wall 601 for attaching panels or doors (not shown). When the extruded wall 601, extruded pillar 201, and endplates 101 and 102 are assembled, an enclosure frame 14 is formed to house electronic components. Panels or doors are then attached over openings 622 to the side screw holes 619 and 209 of extruded pillars 201. In one implementation, panels or doors are attached to endplates 101 and 102 via screw holes located on side surfaces 105. Heat fins 620 are located on the extruded wall 601 in order to dissipate heat. In another embodiment, there are no heat fins 620 on the extruded wall 601. When the panels or doors are attached over openings 622 to enclosure frame 14, the continuous seal 613, endplates 101 and 102, extruded wall 601, extruded pillars 201, adhesive and/or sealant 614 and panels or doors combine to form a weather resistant enclosure.

Figure 7A:
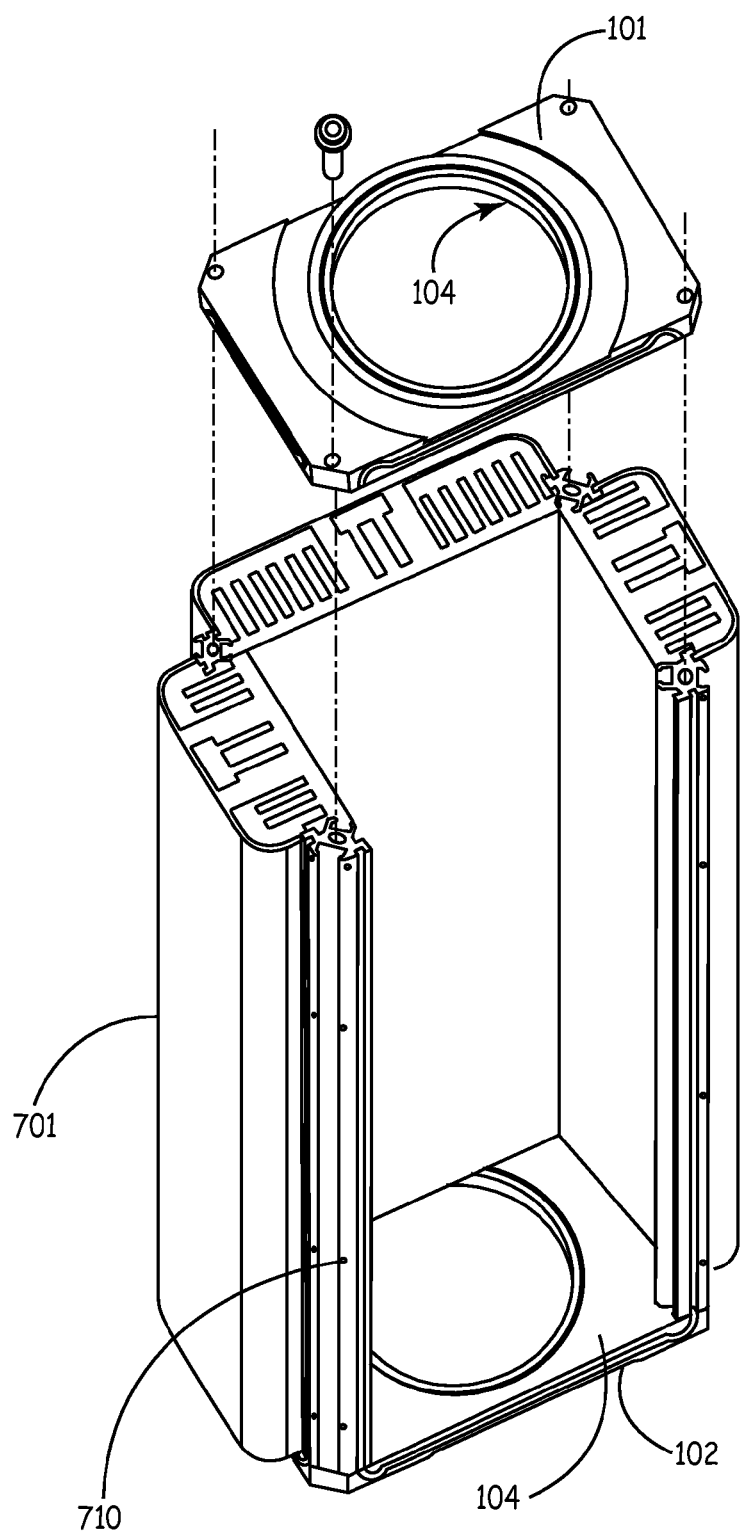
FIGS. 7A-7D show views of an embodiment of an enclosure frame or portions of the enclosure frame in accordance with the present invention.
Figure 7B:
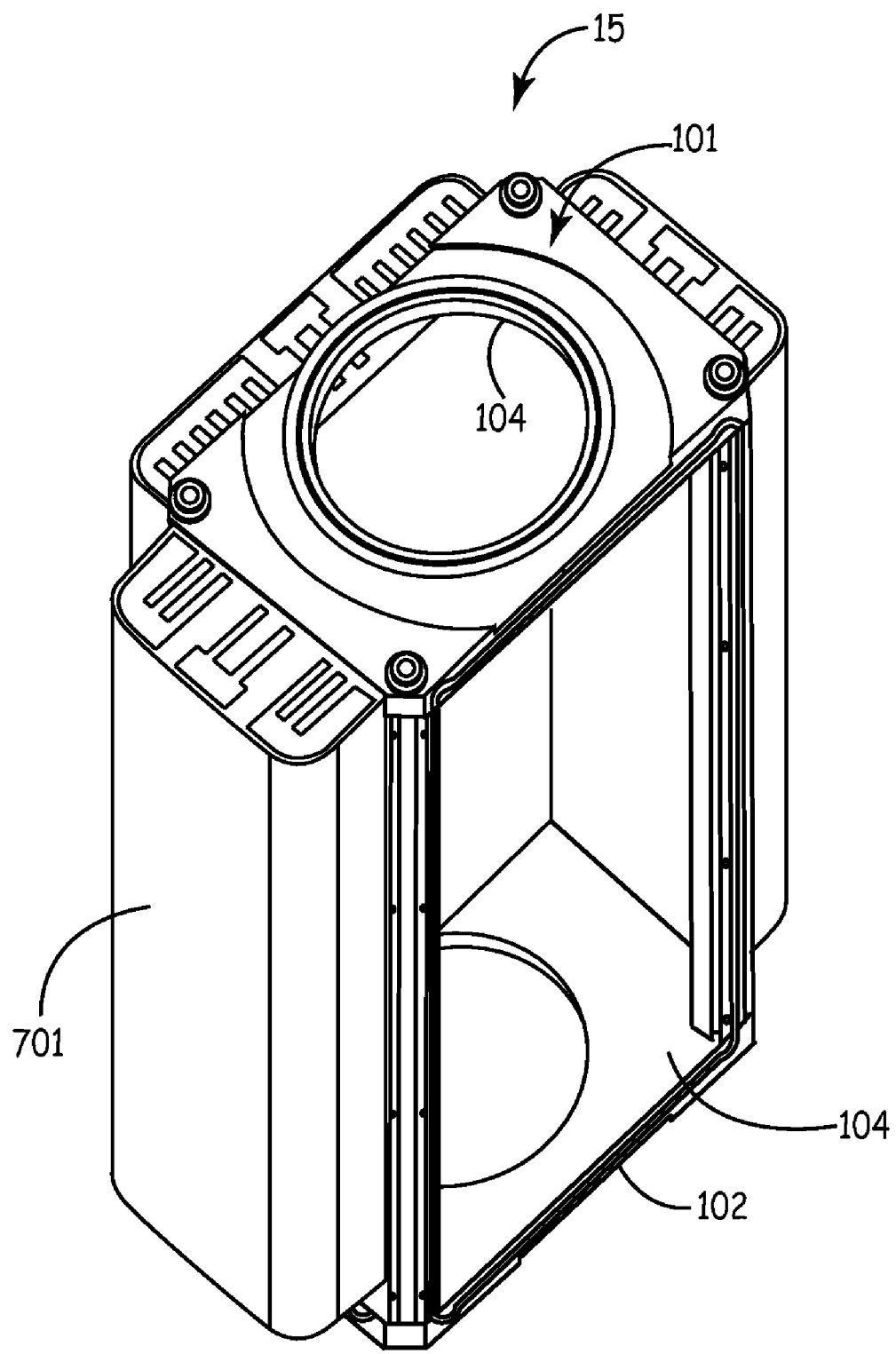
Figure 7C:
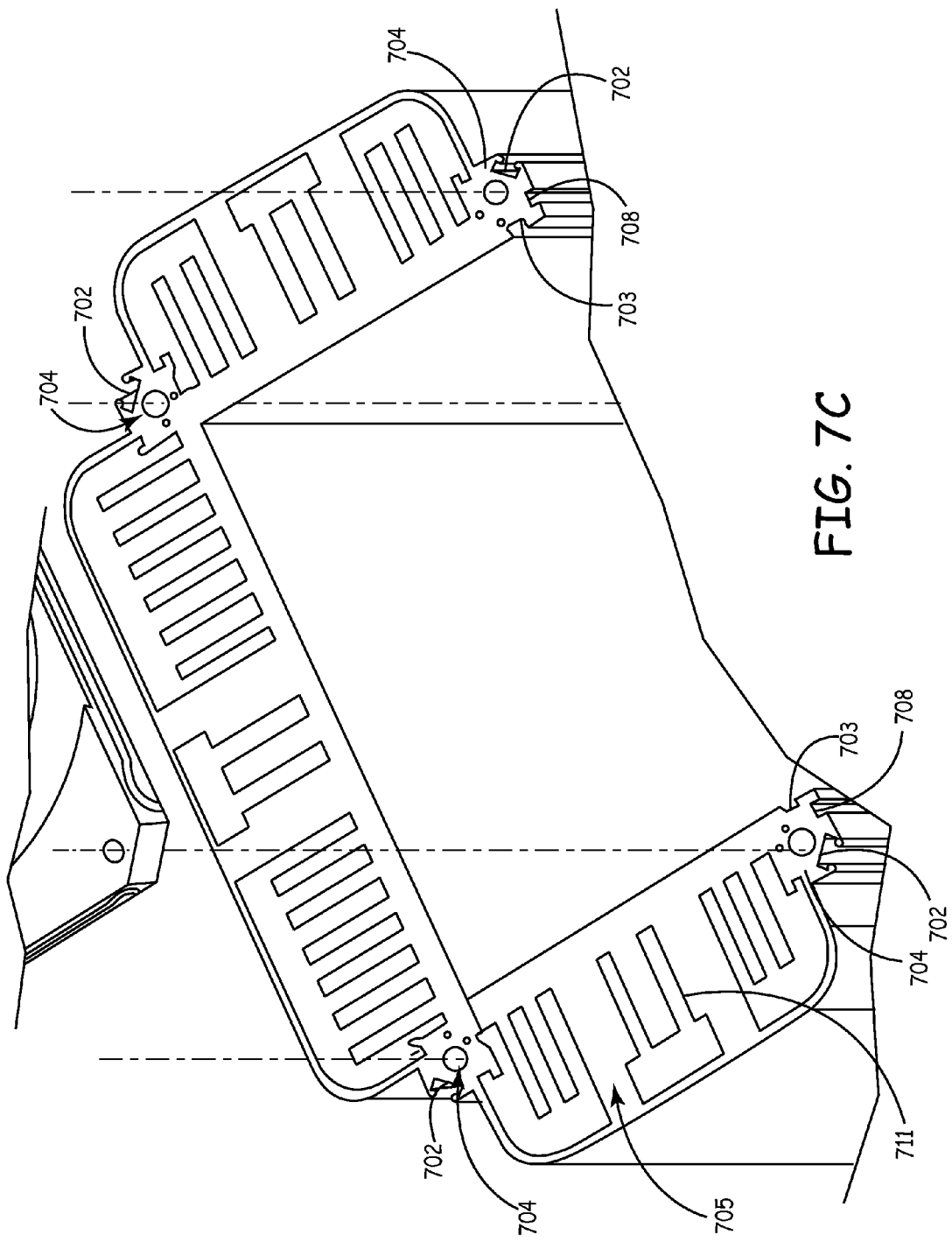
Figure 7D:
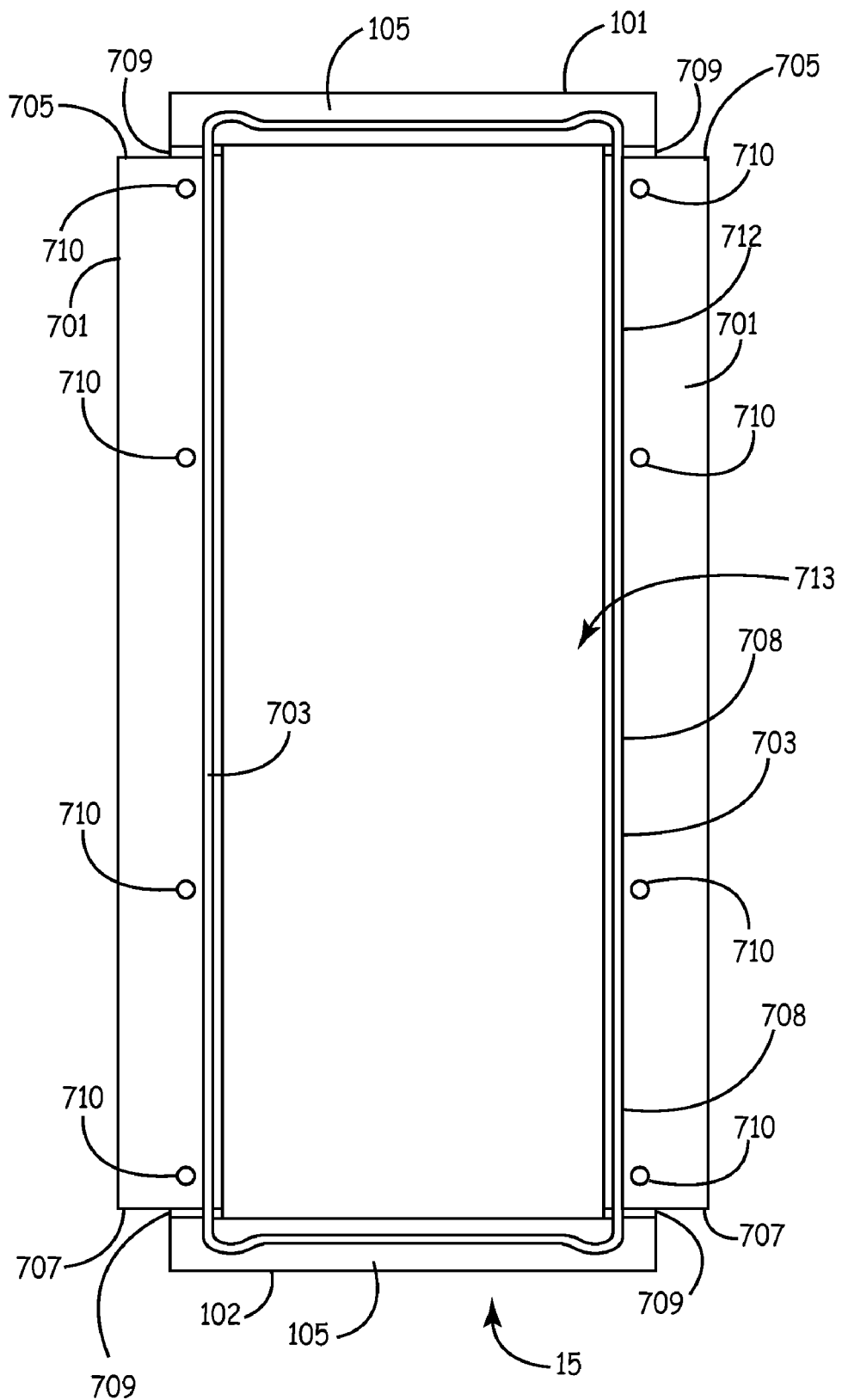

FIGS. 7A-7D show views of an embodiment of an enclosure frame 15 or portions of the enclosure frame 15 in accordance with the present invention. FIG. 7A is an exploded view of the embodiment of the enclosure frame 15 utilizing an extruded U-wall 701 as the supporting structure. FIG. 7B is a view of the embodiment of the enclosure frame 15 utilizing a U-wall 701 as the supporting structure. FIG. 7C is an enlarged view of an end surface of the U-wall 701. FIG. 7D is a front view of the embodiment of enclosure frame 15. The extruded U-wall 701 is attached to inner surface 104 of the top endplate 101 and inner surface 104 of the bottom endplate 102. The extruded U-wall contains at least one T-slot 702, at least one channel 703, four screw holes 704 on a first end surface 705 (FIG. 7C) and four screw holes (not shown) on a second end surface 707. The T-slot 702 and channel 703 extend the length of the extruded U-wall 701. The second end surface 707 and the first end surface 705 oppose each other and are substantially the same in structure and function. In one implementation of this embodiment, there are no T-slots 702 in the U-shaped wall 701.

Once the enclosure frame 15 is assembled, a continuous channel 712 is formed by the channels 106 in the endplates 101 and 102 and the channels 703 of the extruded U-wall 701. A continuous seal 708 is inserted into the continuous channel 712. In this manner, the opening 713 is framed by the continuous seal 708 in continuous channel 712. The continuous seal 708 is similar in form and function to continuous seal 210. An adhesive and/or sealant 709 is located in between of the top endplate 101 and the first surface 705 of the extruded U-walls 701. Adhesive and/or sealant 709 is also located between the bottom endplate 102 and the second surface 707 of the extruded U-walls 701. Side screw holes 710 are located on the U-wall 701 for attaching panels or doors (not shown) over opening 713. When the U-shaped wall 701 and endplates 101 and 102 are assembled, an enclosure frame 15 is formed to house electronic components. Panels or doors are then attached to the side screw holes 710. In one implementation, panels or doors are attached to endplates 101 and 102 via screw holes located on side surfaces 105. Heat fins 711 are located on the U-wall 701 in order to dissipate heat. In another embodiment, there are no heat fins 711 on the extruded wall 701. When the panels or doors are attached to enclosure frame 15 to cover opening 713, the continuous seal 708, endplates 101 and 102, U-shaped wall 701, adhesive and/or sealant 709 and panels or doors combine to form a weather resistant enclosure.

Figure 8:
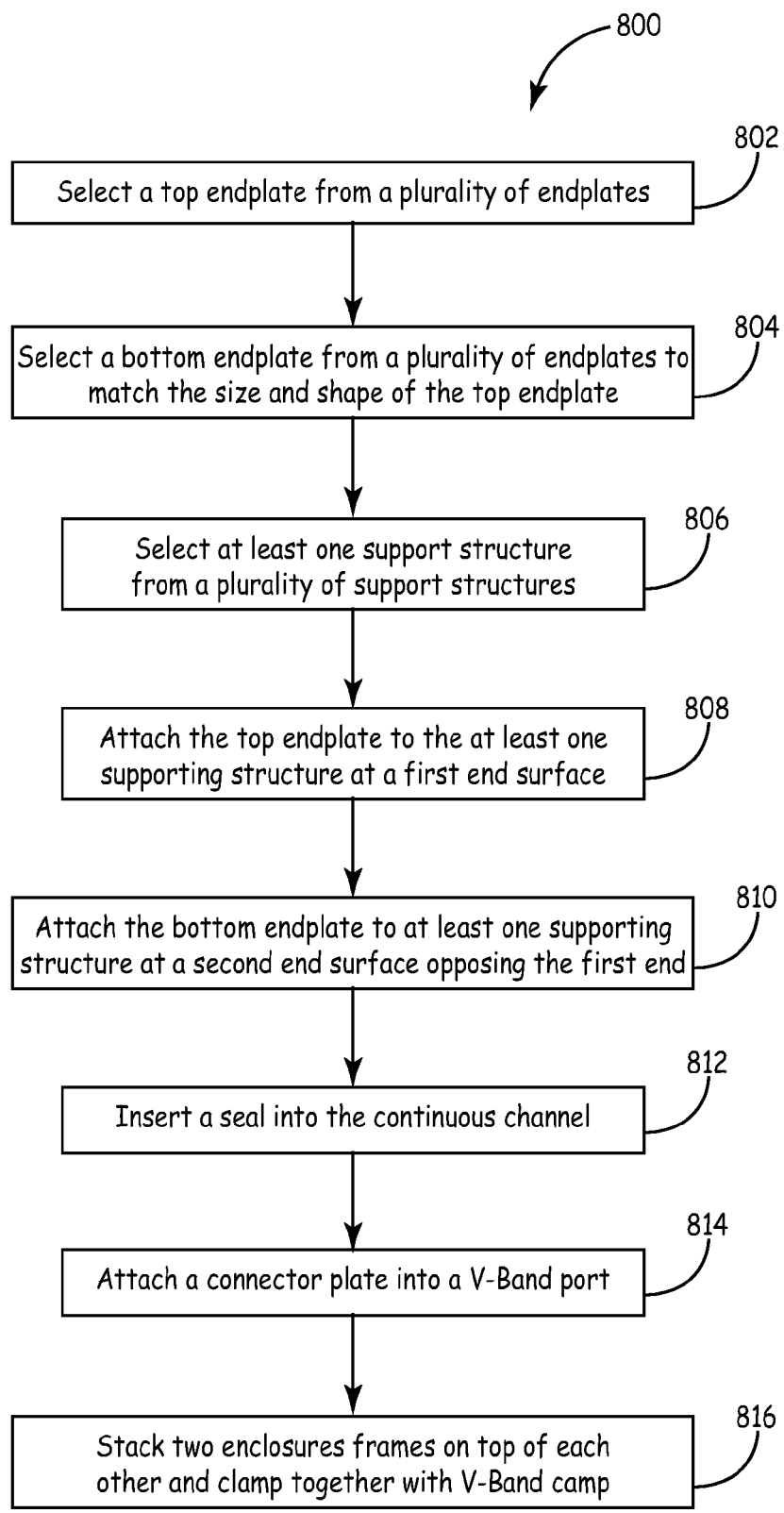
FIG. 8 is a flow diagram of one embodiment of a method to assemble a weather resistant variable enclosure frame in accordance with the present invention.

FIG. 8 is a flow diagram of one embodiment of a method 800 to assemble a weather resistant variable enclosure frame in accordance with the present invention. In one implementation of this embodiment, the weather resistant variable enclosure frame is a weather resistant variable enclosure frame 11 described above with reference to FIGS. 2A-2E. The method 800 is described with reference to the enclosure frame 10 shown in FIGS. 2A-2E although it is to be understood that method 800 can be implemented using other embodiments of the enclosure frame, such as the enclosure frames 12-14 described above with reference to FIGS. 3A-7D, as is understandable by one skilled in the art who reads this document.

At block 802, a top endplate is selected from a plurality of endplates. In one implementation of this embodiment, top endplate 101 is selected. At block 804, a bottom endplate is selected from a plurality of endplates to match the size and shape of the top endplate. In one implementation of this embodiment, bottom endplate 102 is selected. The top and bottom endplates selected have a length L and a width W (FIG. 1A). As defined herein, the length is the longest dimension of the endplate and the width is the second longest dimension of the endplate. The dimensions of the selected endplates and the height of the supporting structures determine the volume of the enclosure frame, as described below. At block 806, at least one support structure is selected from a plurality of support structures of various lengths.

At block 808, a top endplate is attached to a first end surface of at least one supporting structure at an inner surface of the top endplate. The top endplate contains a V-band flange port. In one implementation of this embodiment, a top endplate 101 is attached to four extruded pillars 201 at an inner surface 104 (FIGS. 2A-2E). In another implementation of the embodiment, a top endplate 101 is attached to two extruded walls 301 at an inner surface 104 (FIGS. 3A-3E). The top endplate is attached to the supporting structure by inserting an adhesive and/or sealant between each of the supporting structures and the top endplate, compressing each of the supporting structures to the top endplate, and inserting and screwing screws into respective screw holes. In yet another implementation of the embodiment, the top endplate 101 is attached to the supporting structure by other mechanical fixtures.

At block 810, the bottom endplate is attached to a second end surface of at least one supporting structure at an inner surface of the bottom endplate. The bottom endplate contains a V-band flange port. In one implementation of this embodiment, a bottom endplate 102 is attached to four extruded pillars 201 at an inner surface 104 (FIGS. 2A-2E). In another implementation of the embodiment, a bottom endplate 102 is attached to two extruded walls 301 at an inner surface 104 (FIGS. 3A-3E). The bottom endplate is attached to the supporting structure by inserting an adhesive and/or sealant between each of the supporting structures and the bottom endplate, compressing each of the supporting structures to the bottom endplate, and inserting and screwing screws into respective screw holes. In another implementation of the embodiment, the bottom endplate 102 is attached to the supporting structure by other mechanical fixtures.

The supporting structures are extruded during a manufacturing process as known by those skilled in the art. Each of the at least one supporting structure is formed of cut-to-length pieces that are cut to various lengths as desired by customers. In this manner, the height H (FIG. 2C) of the assembled enclosure frame can be varied. As defined herein, the height H of the enclosure frame is the distance between the top endplate 101 and the bottom endplate 102. Therefore, the height of the enclosure frame is the length of the supporting structure. Each of the supporting structures in one enclosure frame is the same length. The required volume to enclose the electronic component is provided by selecting the endplate out of different sized endplates (each endplate having distinct lengths and widths) and selecting a supporting structure with a length equal to the required height. The volume of the frame enclosure is the length multiplied by the width multiplied by the height.

At block 814, a bulkhead connector plate is attached to the V-band flange port using a V-band clamp. In one implementation, bulkhead connector plate is bulkhead connector plate 111. There can be at least one plug hole for holding bulkhead connectors or for passing cables. In one implementation, the bulkhead connector plate is a plate with no holes.

At block 816, two enclosure frames are attached by V-band clamps attached at the V-band flange ports. For example as shown in FIG. 1F the one enclosure frame 10 is stacked on top of another enclosure frame 10 such that the V-band flange port 107 of one of the endplates 102 on the top enclosure frame 10 is facing the V-band flange port 107 of one of the endplates 101 of the bottom enclosure frame 10. A V-band clamp 700 is then used to clamp the two enclosure frames together.

By judicious selection of the length, width and height of the enclosure frame, the volume of the electronic component can be slightly less than the volume of the weather resistant variable enclosure so that the space required for an assembled enclosure is minimized.

Figure 9:
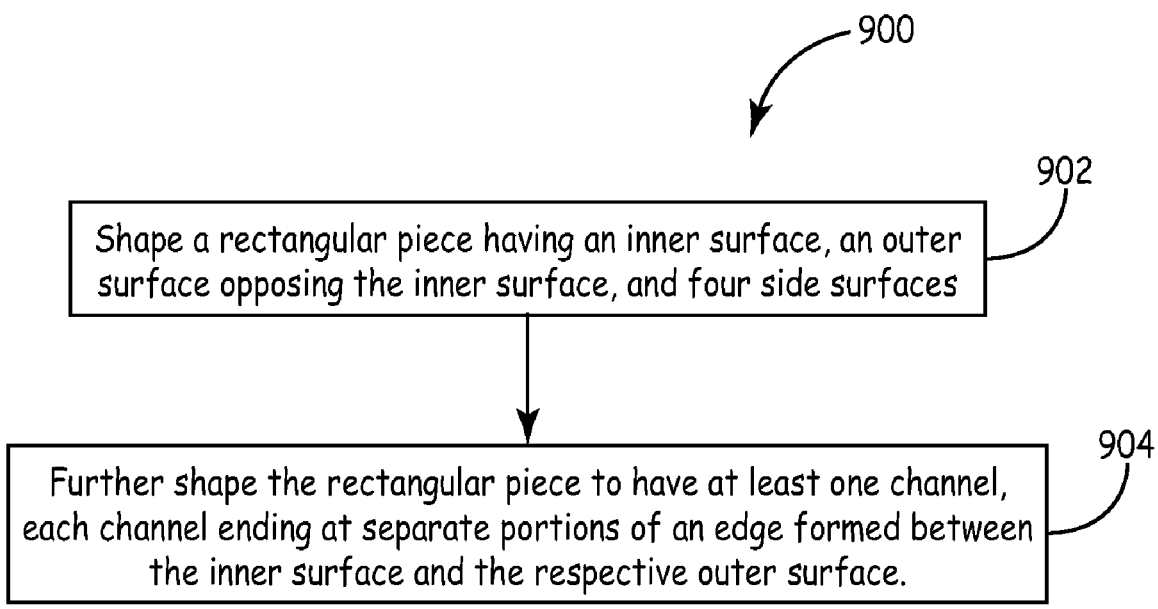
FIG. 9 is a flow diagram of one embodiment of a method to form the endplates in accordance with the present invention.

FIG. 9 is a flow diagram of one embodiment of a method 900 to form the endplates in accordance with the present invention. In one implementation of this embodiment, the endplates are endplates described above with reference to FIGS. 1A-1F. The method 900 is described with reference to the endplates 101 and 102 shown in FIGS. 1A-1F although it is to be understood that method 900 can be implemented using other embodiments of the endplate, as is understandable by one skilled in the art who reads this document.

At block 902, a rectangular piece is shaped having an inner surface, an outer surface opposing the inner surface, and four side surfaces. In one implementation, the rectangular piece is metal such as aluminum.

At block 904, the rectangular piece is further shaped to have at least one channel on a side surface, each channel ending at separate portions of an edge formed between the inner surface and the respective side surface.

In another embodiment, the screws used to fasten endplates to the supporting structures contain a screw drive which has a hole with an internal female thread in the hole. A threaded fastener attached to a lifting apparatus can then be screwed into the hole with the internal female thread, which allows for the lifting apparatus to lift the enclosure frame.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

The invention claimed is:

1. A weather resistant variable enclosure frame configured to enclose at least one electronic component, the enclosure frame comprising:
    a top endplate having a channel on at least one side surface;
    a bottom endplate, opposing the top endplate, having a channel on at least one side surface; and
    at least one supporting structure to offset the top endplate from the bottom endplate;
    wherein the at least one supporting structure is attached to an inner surface of the top endplate and an inner surface of the bottom endplate;
    wherein the at least one supporting structure is a cut-to-length piece;
    wherein the at least one supporting structure has at least one channel that extends the length of the at least one supporting structure;
    wherein at least one opening is formed by the top endplate, the bottom endplate, and the at least one supporting structure;
    wherein the channels in the top endplate, the at least one supporting structure, and the bottom endplate combine to form at least one continuous channel configured to hold at least one respective continuous seal; and
    wherein the at least one supporting structure is configured to attach a panel to each of the at least one supporting structure, so that when at least one panel is attached to cover the respective at least one opening, a weather resistant enclosure is formed.

2. The enclosure frame of claim 1, wherein the at least one supporting structure has at least one T-slot that extends a length of the at least one supporting structure.

3. The enclosure frame of claim 1, wherein the top and bottom endplates are formed from a rectangular piece, the rectangular piece having four side surfaces at the edges of the rectangular piece, at least one of the four side surfaces having the channel that extends from a first portion of an edge formed between the inner surface and the respective side surface to a second portion of the edge.

4. The enclosure frame of claim 3, wherein at least one of the top endplate and bottom endplate having a V-band flange port extending from an outer surface to the inner surface.

5. The enclosure frame of claim 4, wherein the V-band flange port is attachable by a V-band clamp to another V-band flange port in an endplate of another similar enclosure frame, wherein the enclosure frames are stacked.

6. The enclosure frame of claim 4, wherein the at least one of the top and bottom endplate further comprises a bulkhead connector plate configured to attach to the V-band flange port using a V-band clamp.

7. The enclosure frame of claim 6, wherein the bulkhead connector plate has at least one plug hole configured to hold the bulkhead connector or cable.

8. The enclosure frame of claim 1, further comprising:
    one of an adhesive or a sealant, and the adhesive and the sealant located in between the top endplate and the at least one supporting structure, and located in between the at least one supporting structure and the bottom endplate.

9. The enclosure frame of claim 1, wherein at least one of the supporting structures is a heat-expelling wall comprising a plurality of heat fins to dissipate heat.

10. The enclosure frame of claim 1, wherein the at least one supporting structure comprises a plurality of extruded pillars.

11. The enclosure frame of claim 10, wherein the extruded pillars comprise a first screw hole on a first end surface and a second screw hole on a second end surface.

12. The enclosure frame of claim 1, wherein the at least one supporting structure comprises two walls.

13. The enclosure frame of claim 12, the two walls each comprising:
    at least one screw hole on a first end surface and at least one screw hole on a second end surface;
    wherein the two walls are attached to opposing edges of the inner surface of the top endplate by at least two respective screws; and
    wherein the two walls are attached on opposing edges of the inner surface of the bottom endplate by at least two respective screws.

14. The enclosure frame of claim 1, wherein the at least one supporting structure comprises:
    two walls; and
    an extruded pillar.

15. The enclosure frame of claim 14, the extruded pillar comprising:
- a first screw hole on a first end surface and a second screw hole on a second end surface; and
- the two walls each comprising:
- at least one screw hole on a first end surface and at least one screw hole on a second end surface;
- wherein the two walls are attached to the inner surface of the top endplate on adjoining edges of the top endplate via at least two respective screws;
- wherein the two walls are attached to the inner surface of the bottom endplate on adjoining edges of the bottom endplate via at least two respective screws;
- wherein the extruded pillar is attached to the inner surface of the top endplate at a corner opposing the two walls formed by the adjoining edges of the top endplate;
- wherein the extruded pillar is attached to the inner surface of the bottom endplate at the corner opposing the two walls formed by the adjoining edges of the bottom endplate; and
- wherein one of an adhesive, a sealant and the adhesive and the sealant is located between the two walls.

16. The enclosure frame of claim 1, wherein the at least one supporting structure comprises:
- a L-shaped wall; and
- an extruded pillar.

17. The enclosure frame of claim 16, the extruded pillar comprising:
- a first screw hole on a first end surface and a second screw hole on a second end surface; and
- the L-shaped wall comprising:
- at least one screw hole on a first end surface and at least one screw hole on a second end surface;
- wherein the L-shaped wall is attached to the inner surface of the top endplate via at least one screw;
- wherein the L-shaped wall is attached to the inner surface of the bottom endplate via at least one screw;
- wherein the extruded pillar is attached to the inner surface of the top endplate at a corner opposing the L-shaped wall; and
- wherein the extruded pillar is attached to the inner surface of the bottom endplate at the corner opposing the L-shaped wall.

18. The enclosure frame of claim 1, wherein the at least one supporting structure comprises:
- a wall; and
- two extruded pillars.

19. The enclosure frame of claim 18, the two extruded pillars comprising:
- a first screw hole on a first end surface and a second screw hole on a second end surface; and
- the wall comprising:
- at least one screw hole on a first end surface and at least one screw hole on a second end surface;
- wherein the wall is attached to the inner surface of the top endplate via at least one screw;
- wherein the wall is attached to the inner surface of the bottom endplate via at least one screw;
- wherein the extruded pillars are attached to the inner surface of the top endplate at a two corners opposing the wall; and
- wherein the extruded pillars are attached to the inner surface of the bottom endplate at the two corners opposing the wall.

20. The enclosure frame of claim 1, wherein the at least one supporting structure comprises:
- an U-shaped wall.

21. The enclosure frame of claim 20, the U-shaped wall comprising:
- at least one screw hole on a first end surface and at least one screw hole on a second end surface;
- wherein the U-shaped wall is attached to the inner surface of the top endplate via at least one screw; and
- wherein the U-shaped wall is attached to the inner surface of the bottom endplate via at least one screw.

* * * * *